(12) United States Patent
Shin et al.

(10) Patent No.: US 11,990,095 B2
(45) Date of Patent: *May 21, 2024

(54) DISPLAY MODULE WHICH PREVENTS SIGNAL LINES FROM BEING DAMAGED

(71) Applicant: Samsung Display Co., Ltd., Yongin-Si (KR)

(72) Inventors: Jaemin Shin, Suwon-si (KR); Sangwoo Kim, Seoul (KR); Gyujeong Lee, Anyang-si (KR); Hyejin Joo, Suwon-si (KR); Jongho Hong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,345

(22) Filed: Apr. 7, 2022

(65) Prior Publication Data

US 2022/0230595 A1 Jul. 21, 2022

Related U.S. Application Data

(63) Continuation of application No. 16/830,174, filed on Mar. 25, 2020, now Pat. No. 11,341,921.

(30) Foreign Application Priority Data

Mar. 26, 2019 (KR) .................... 10-2019-0033977

(51) Int. Cl.
*G09G 3/30* (2006.01)
*G06F 1/16* (2006.01)
(Continued)

(52) U.S. Cl.
CPC ......... *G09G 3/3266* (2013.01); *G06F 1/1652* (2013.01); *G09F 9/301* (2013.01); *G09G 3/3291* (2013.01); *G09G 2380/02* (2013.01)

(58) Field of Classification Search
CPC .............. G06F 1/1652; G09F 9/301; G09G 3/30–3493
See application file for complete search history.

(56) References Cited

U.S. PATENT DOCUMENTS 10,038,163 B2 7/2018 Kim et al.
10,679,566 B2 6/2020 Jeon et al.
(Continued)

FOREIGN PATENT DOCUMENTS

CN 109064900 A 12/2018
KR 10-2017-0113934 A 10/2017
KR 10-2018-0045968 A 5/2018

OTHER PUBLICATIONS

Jong-Ho Hong, Jae Min Shin, Gun Mo Kim, Hyejin Joo, Gyung Soon Park, In Bom Hwang, Min Woo Kim, Won-Sang Park, Hye Yong Chu (SID Member), and Sungchul Kim (SID Member) with Samsung Display Co., Ltd., 1, Samsung-ro, Giheung-gu, Yongin-si, Gyeonggi-do 17113, Korea, "9.1-inch stretchable AMOLED display based on LTPS technology", Journal of the SID 25/3, 2017, 6 pages (194-199), © Copyright 2017 Society for Information Display 1071-0922/17/2503-0547.

(Continued)

*Primary Examiner* — Sanghyuk Park
(74) *Attorney, Agent, or Firm* — Innovation Counsel LLP

(57) ABSTRACT

A display panel may include a base, a circuit layer disposed on the base, an emission element layer disposed on the circuit layer, and an encapsulation layer disposed on the emission element layer. The base may include an island portion and a plurality of connecting portions and may be stretchable or extendable in a specific direction. The circuit layer may include a plurality of transistors and lines. An elongation of a material, which is included in a control electrode of each of the plurality of transistors, may be smaller than an elongation of a material included in the lines.

(Continued)

The lines may be disposed on the connecting portions, and some of the lines may be overlapped with each other.

19 Claims, 16 Drawing Sheets

(51) Int. Cl.
  *G09F 9/30* (2006.01)
  *G09G 3/3266* (2016.01)
  *G09G 3/3291* (2016.01)
  *G09G 3/36* (2006.01)

(56) References Cited

U.S. PATENT DOCUMENTS

| | | | |
|---|---|---|---|
| 10,950,166 B2 | 3/2021 | Hong et al. | |
| 10,985,332 B2 | 4/2021 | Shin et al. | |
| 2006/0178072 A1* | 8/2006 | Konda | H10K 71/00 445/6 |
| 2008/0252203 A1* | 10/2008 | Lee | H10K 59/131 313/504 |
| 2011/0210324 A1* | 9/2011 | Sakakura | H01L 27/1225 438/46 |
| 2015/0069363 A1* | 3/2015 | Ota | H10K 59/1213 257/40 |
| 2016/0268352 A1* | 9/2016 | Hong | H10K 59/88 |
| 2017/0117343 A1* | 4/2017 | Oh | G09G 3/3258 |
| 2017/0288168 A1 | 10/2017 | Kim et al. | |
| 2018/0046221 A1 | 2/2018 | Choi et al. | |
| 2018/0047799 A1 | 2/2018 | Lim et al. | |
| 2018/0052493 A1 | 2/2018 | Hong et al. | |
| 2018/0090699 A1 | 3/2018 | Shin et al. | |
| 2018/0114825 A1 | 4/2018 | Hong et al. | |
| 2018/0342699 A1 | 11/2018 | Son et al. | |

OTHER PUBLICATIONS

Extended European Search Report, Application No. 20166020.6 dated Sep. 25, 2020, 9 pages.

\* cited by examiner

DISPLAY MODULE WHICH PREVENTS SIGNAL LINES FROM BEING DAMAGED

CROSS-REFERENCE TO RELATED APPLICATIONS

This U.S. non-provisional patent application is a continuation of U.S. patent application Ser. No. 16/830,174, filed on Mar. 25, 2020, which claims priority under 35 U.S.C. § 119 to Korean Patent Application No. 10-2019-0033977, filed on Mar. 26, 2019, in the Korean Intellectual Property Office, the entire contents of which are hereby incorporated by reference.

BACKGROUND

The present disclosure relates to a display module, and in particular, to a stretchable display module, which can be stretched by an external force.

A display device displays various images on a display screen to provide image information to a user. In general, the display device displays information within a given display screen.

Recently, a flexible display device including a flexible display module is being developed. Unlike a flat-panel display device, the flexible display device can be folded, rolled, or curved, like a piece of paper, or can be stretched. Since the shape of the flexible display device can be variously changed, the flexible display device has excellent portability, without limitation of a screen size. In addition, the flexible display device can be easily disposed on a curved object, and thus, it is possible to improve user convenience.

For such a display device that is stretchable in a specific direction, an emission element and interconnection lines are disposed on a stretchable base, but the interconnection lines may be damaged when the base substrate is stretched.

SUMMARY

An embodiment of the inventive concept provides a display module configured to prevent line, which are used to deliver electric signals to pixels, from being damaged when it is stretched by an external force.

According to an embodiment of the inventive concept, a display module may include a base, an active pattern, a gate insulating layer, a gate metal pattern, an interlayer insulating layer, a first circuit insulating layer, a first metal pattern, a plurality of first lines, a second circuit insulating layer, a second metal pattern, a plurality of second lines, a third circuit insulating layer, a third metal pattern, and a plurality of third lines.

In an embodiment, the base may include a plurality of unit portions, each of the plurality of unit portions including an island portion and a plurality of connecting portions extending from the island portion and connecting adjacent island portions.

In an embodiment, the active pattern may be disposed on the base and may be overlapped with the island portion. The active pattern may include a semiconductor material.

In an embodiment, the gate insulating layer may be disposed on the base to cover the active pattern.

In an embodiment, the gate metal pattern may be disposed on the gate insulating layer and may be overlapped with the island portion.

In an embodiment, the gate metal pattern may not extend over the plurality of connecting portions.

In an embodiment, the first circuit insulating layer may be disposed on the base to cover at least a portion of the gate insulating layer. The first circuit insulating layer may be overlapped with the island portion and the plurality of connecting portions and may include a first contact hole defined therein.

In an embodiment, the first metal pattern may be disposed on the first circuit insulating layer and may be overlapped with the island portion.

In an embodiment, the plurality of first lines may be disposed on the first circuit insulating layer. Each of the plurality of first lines may be overlapped with at least one of the plurality of connecting portions. At least one of the plurality of first lines may be electrically connected to the gate metal pattern through the first contact hole.

In an embodiment, the second circuit insulating layer may be disposed on the first metal pattern and the plurality of first lines.

In an embodiment, the second metal pattern may be disposed on the second circuit insulating layer and may be overlapped with the island portion.

In an embodiment, the plurality of second lines may be disposed on the second circuit insulating layer. Each of the plurality of second lines may be overlapped with at least one of the plurality of connecting portions.

In an embodiment, the third circuit insulating layer may be disposed on the second metal pattern and the plurality of second lines.

In an embodiment, the third metal pattern may be disposed on the third circuit insulating layer and may be overlapped with the island portion.

In an embodiment, the plurality of third lines may be disposed on the third circuit insulating layer. Each of the plurality of third lines may be overlapped with at least one of the plurality of connecting portions.

In an embodiment, the plurality of unit portions may include a first unit portion and a second unit portion, and a distance between the connecting portions of the first and second unit portions may be changed when a force is exerted from an outside.

In an embodiment, the second circuit insulating layer may include a plurality of second contact holes defined therein. The second metal pattern may be electrically connected to the first metal pattern through one of the plurality of second contact holes. At least one of the plurality of second lines may be electrically connected to the first metal pattern through another of the plurality of second contact holes.

In an embodiment, the third circuit insulating layer may include a third contact hole defined therein, and the third metal pattern may be electrically connected to the second metal pattern through the third contact hole.

In an embodiment, the display module may further include a fourth circuit insulating layer disposed on the third metal pattern and the plurality of third lines, an anode electrode disposed on the fourth circuit insulating layer, an emission layer disposed on the anode electrode, and a cathode electrode disposed on the emission layer.

In an embodiment, the fourth circuit insulating layer may include a fourth contact hole defined therein, and the anode electrode may be electrically connected to the third metal pattern through the fourth contact hole.

In an embodiment, the fourth circuit insulating layer may have a light shielding property.

In an embodiment, the gate metal pattern may include a first metal material. Each of the first metal pattern, the second metal pattern, the third metal pattern, the plurality of first lines, the plurality of second lines, and the plurality of third lines may include a second metal material different from the first metal material.

In an embodiment, the first metal material may include molybdenum, and the second metal material may include at least one of titanium or aluminum.

In an embodiment, the first metal material may have a first elongation, and the second metal material may have a second elongation greater than the first elongation.

In an embodiment, at least one of the plurality of connecting portions, at least one of the plurality of first lines, at least one of the plurality of second lines, and at least one of the plurality of third lines may be overlapped with each other.

In an embodiment, when viewed in a plan view, a width of each of the plurality of second lines may be larger than a width of each of the plurality of first lines and a width of each of the plurality of third lines.

In an embodiment, at least one of the plurality of second lines may be overlapped with at least two adjacent first lines of the plurality of first lines.

In an embodiment, the active pattern, the gate metal pattern and the first metal pattern constitute a plurality of transistors and a capacitor, and the plurality of first lines, the plurality of second lines, and the plurality of third lines may be electrically connected to the plurality of transistors or the capacitor.

In an embodiment, the display module may further include a scan driver, and a data driver. The plurality of first lines may include at least a portion of a data line receiving a data signal from the data driver, at least a portion of a scan line receiving a scan signal from the scan driver, and at least a portion of an emission control line receiving an emission control signal from the scan driver.

In an embodiment, the plurality of second lines may include at least a portion of a first power line, which provides a first electric potential to one of the plurality of transistors, and at least a portion of a second power line, which provides the first electric potential to the capacitor.

In an embodiment, the display module may further include a fourth circuit insulating layer disposed on the third metal pattern and the plurality of third lines, an anode electrode disposed on the fourth circuit insulating layer, an emission layer disposed on the anode electrode, and a cathode electrode disposed on the emission layer. The plurality of third lines may include at least a portion of a third power line, which provides a second electric potential different from the first electric potential to the cathode electrode, and at least a portion of an initializing power line, which provides an initialization potential to one of the plurality of transistors.

In an embodiment, the first electric potential may range from 4.5V to 5.5V, the second electric potential may range from −5.5V to −4.5V.

In an embodiment, the plurality of connecting portions may include a first connecting portion extending in a first direction, a second connecting portion extending in a second direction crossing the first direction, a third connecting portion extending in a third direction opposite to the first direction, and a fourth connecting portion extending in a fourth direction opposite to the second direction. The first power line may be disposed on the first connecting portion or the third connecting portion, and the second power line may be disposed on the second connecting portion or the fourth connecting portion.

In an embodiment, the display module may further include a fourth circuit insulating layer, a first anode electrode, a second anode electrode, and a third anode electrode. The fourth circuit insulating layer may be disposed on the third metal pattern and the plurality of third lines. The first anode electrode may be disposed on the fourth circuit insulating layer to have a first length in a specific direction. The second anode electrode may be disposed on the fourth circuit insulating layer and may be disposed adjacent to the first anode electrode. The second anode electrode may have a second length in the specific direction. The third anode electrode may be disposed on the fourth circuit insulating layer and may be disposed adjacent to the second anode electrode. The third anode electrode may have a third length in the specific direction. The second length may be longer than the first length and the third length.

In an embodiment, the second anode electrode may be disposed between the first anode electrode and the third anode electrode.

According to an embodiment of the inventive concept, a display module may include a base, a plurality of transistors, a capacitor, a plurality of first lines, a plurality of second lines, and a plurality of third lines.

In an embodiment, the base may include a plurality of unit portions, each of the plurality of unit portions including an island portion and a plurality of connecting portions extending from the island portion. The plurality of transistors may be disposed on the island portion. The capacitor may be disposed on the island portion. The plurality of first lines may be disposed on the plurality of connecting portions and may be electrically connected to at least one of the plurality of transistors. The plurality of second lines may be electrically connected to at least one of the plurality of transistors and the capacitor and may be overlapped with a corresponding first line of the plurality of first lines. The plurality of third lines may be electrically connected to at least one of the plurality of transistors and may be overlapped with a corresponding first line of the plurality of first lines and a corresponding second line of the plurality of second lines.

In an embodiment, each of the plurality of second lines may be overlapped with at least two adjacent first lines of the plurality of first lines.

In an embodiment, one of the plurality of second lines may be disposed on at least two of the plurality of first lines, and at least two of the plurality of third lines may be disposed on one of the plurality of second lines.

In an embodiment, a display module may include a base including a plurality of island portions spaced apart from each other, a plurality of connecting portions and a plurality of openings formed through the base; and a plurality of pixels disposed on the plurality of island portions and including a plurality of gate metal patterns; a plurality of first lines disposed on the plurality of connecting portions, connected to the plurality of gate metal patterns and supplying a plurality of gate signals to the plurality of pixels, wherein the plurality of gate metal patterns and the plurality of first lines are formed of different materials, and wherein each of the plurality of connecting portions extends from an island portion of the plurality of island portions to connect two adjacent island portions of the plurality of island portions to each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
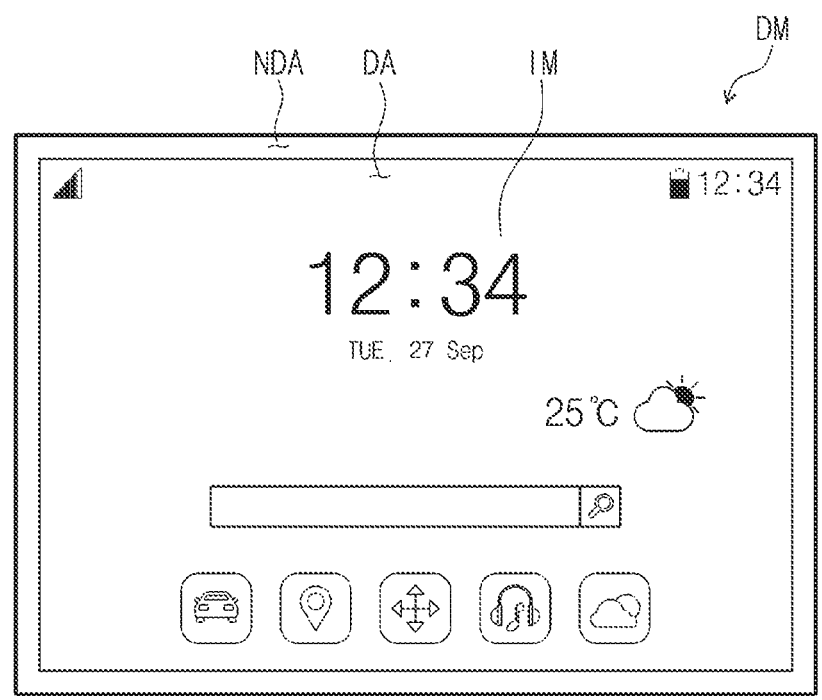
FIGS. 1 and 2 are diagrams, each of which illustrates a display module according to an example embodiment of the inventive concept.
Figure 1:
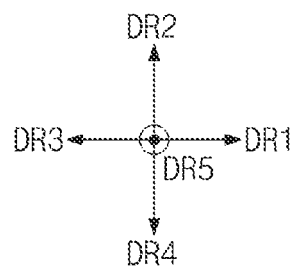

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
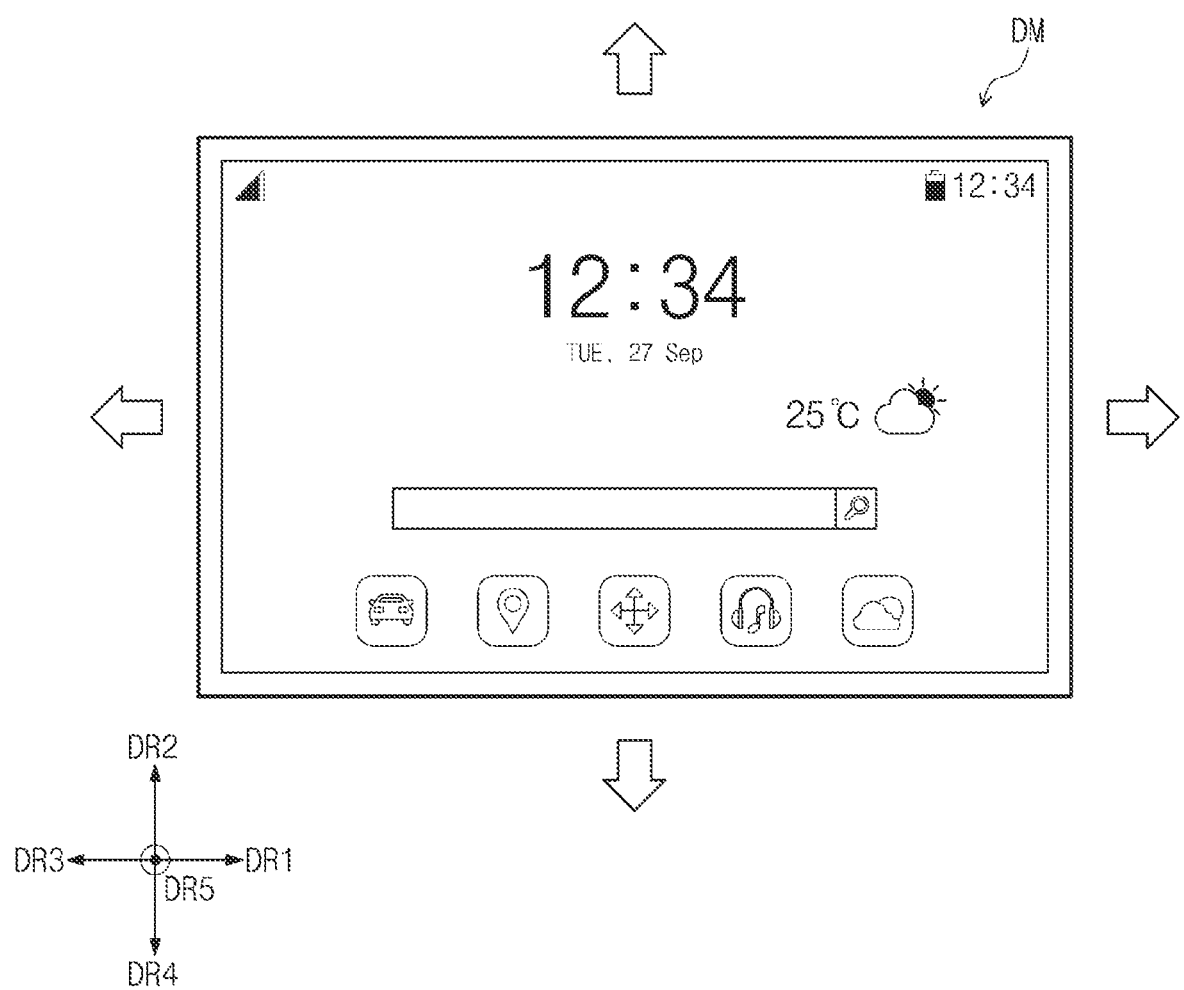

FIGS. 1 and 2 are diagrams, each of which illustrates a display module DM according to an example embodiment of the inventive concept. FIG. 1 illustrates a first state of the display module DM, which is not stretched. FIG. 2 illustrate a second state of the display module DM that is stretched in a specific direction by an external force.

The display module DM may be used as a part of one of large-sized electronic devices (e.g., television sets and monitors), small-sized electronic devices or medium-sized electronic devices (e.g., cellular phones, tablets, car navigation systems, game machines, or smartwatches).

The display module DM may include a display region DA and a non-display region NDA.

The display region DA, on which an image IM is displayed, may be parallel to a plane defined by a first direction axis DR1 and a second direction axis DR2. A third direction axis DR3 may be oriented in a direction opposite to the first direction axis DR1, and a fourth direction axis DR4 may be oriented in a direction opposite to the second direction axis DR2.

A fifth direction axis DR5 will refer to a direction normal to the display region DA (i.e., a thickness direction of the display module DM). A front or top surface and a rear or bottom surface of each member may be distinguished, based on the fifth direction axis DR5. However, directions indicated by the first to fifth direction axes DR1, DR2, DR3, DR4, and DR5 may be relative concepts, and in certain embodiments, they may be altered to indicate other directions. Hereinafter, first to fifth directions may be directions indicated by the first to fifth direction axes DR1, DR2, DR3, DR4, and DR5, respectively, and will be identified with the same reference numbers.

The shape of the display region DA shown in FIG. 1 may be just an example, and the shape of the display region DA may be freely changed as required.

The non-display region NDA may be adjacent to the display region DA and may not be used to display the image IM. A bezel region of the display module DM may be the non-display region NDA.

The non-display region NDA may surround the display region DA. However, the inventive concept is not limited to this example, and the shapes of the display region DA and the non-display region NDA may be variously altered in a complementary manner.

Figure 3:
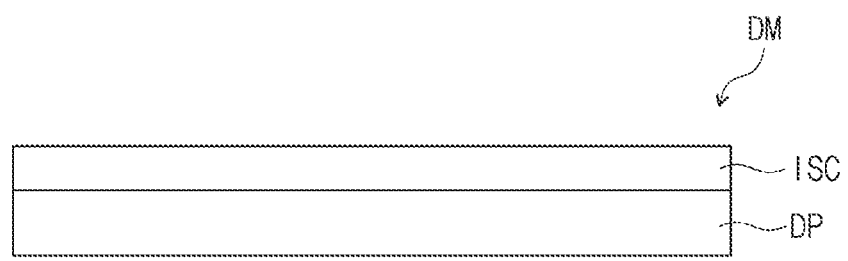
FIGS. 3 and 4 are sectional views, each of which illustrates a display module according to an example embodiment of the inventive concept.
Figure 4:
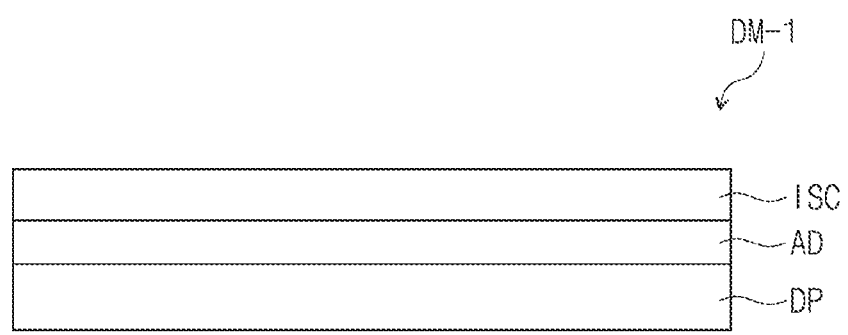

FIGS. 3 and 4 are sectional views, each of which illustrates a display module DM or DM-1 according to an example embodiment of the inventive concept.

Referring to FIG. 3, the display module DM may include a display panel DP and an input sensing circuit ISC. The input sensing circuit ISC may sense a touch event and/or a change in pressure to be exerted from the outside.

The input sensing circuit ISC may be directly disposed on a thin encapsulation layer (not shown) of the display panel DP. Here, the expression "be directly disposed" may mean that the input sensing circuit ISC is disposed on the display panel DP without any adhesive layer interposed therebetween.

Referring to FIG. 4, the display module DM-1 may include the display panel DP, the input sensing circuit ISC, and an adhesive layer AD dispose between the display panel DP and the input sensing circuit ISC. The display panel DP and the input sensing circuit ISC may be adhered to each other by the adhesive layer AD.

Figure 5:
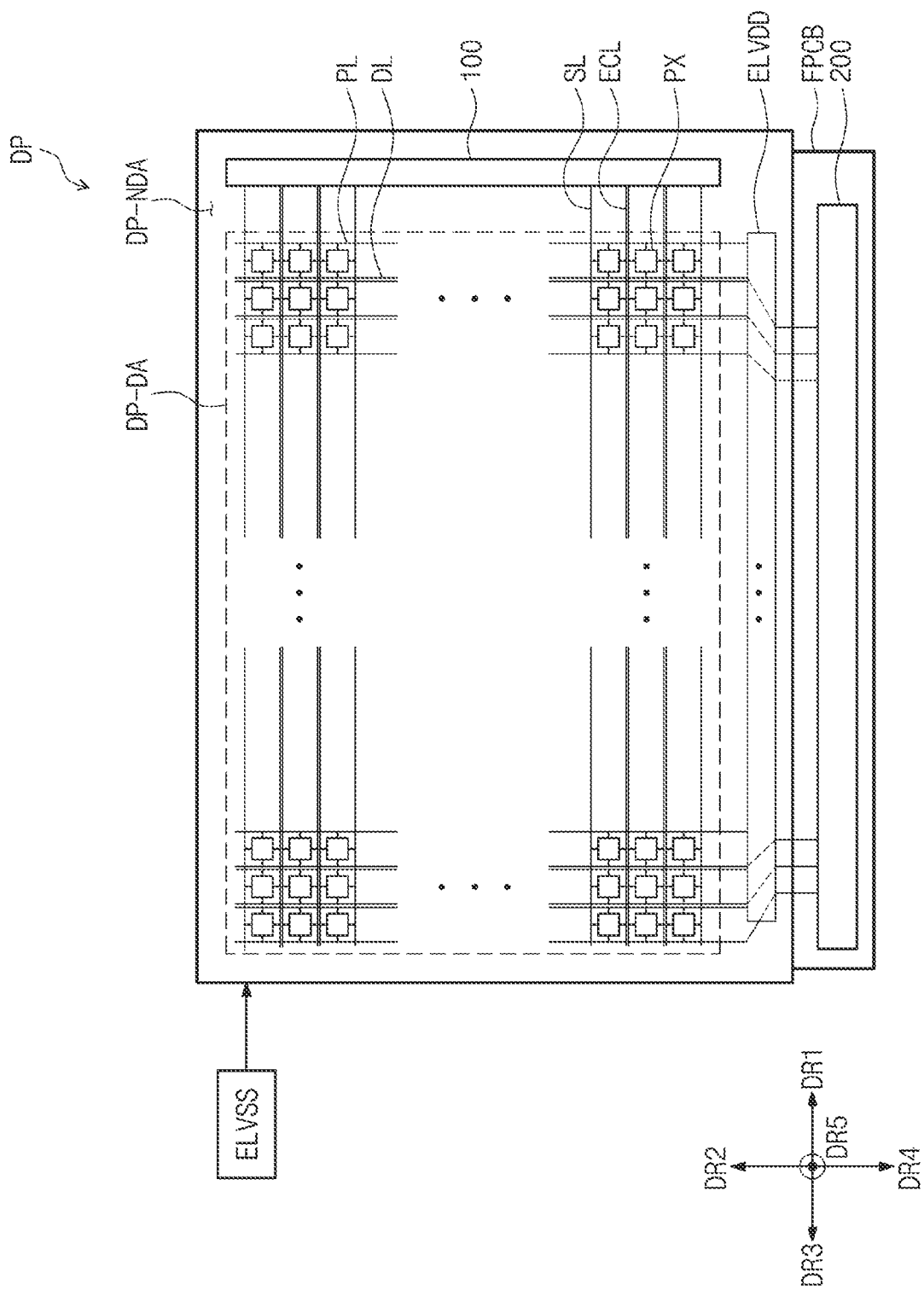
FIG. 5 is a diagram illustrating a display panel according to an example embodiment of the inventive concept.

FIG. 5 is a diagram illustrating the display panel DP according to an example embodiment of the inventive concept.

The display panel DP may include a display region DP-DA and a non-display region DP-NDA, when viewed in a plan view. In the present embodiment, the non-display region DP-NDA may be defined along an edge or outer boundary of the display region DP-DA. The display region DP-DA and the non-display region DP-NDA of the display panel DP may correspond to the display region DA and the non-display region NDA, respectively, of the display module DM shown in FIG. 1.

The display panel DP may include a scan driver 100, a data driver 200, a plurality of scan lines SL, a plurality of emission control lines ECL, a plurality of data lines DL, a plurality of power lines PL, and a plurality of pixels PX. The pixels PX may be disposed in the display region DP-DA. Each of the pixels PX may include an emission element LD (e.g., see FIG. 6) and a pixel circuit CC (e.g., see FIG. 6) connected thereto.

The scan driver 100 may include a scan driving part and an emission control driving part.

The scan driving part may generate scan signals and output the generated scan signals sequentially to the scan lines SL. The emission control driving part may generate emission control signals and output the generated emission control signals to the emission control lines ECL.

In certain embodiments, the scan driving part and the emission control driving part may be provided as a single circuit, not as separate elements, in the scan driver 100.

The scan driver 100 may include a plurality of thin film transistors that are formed by the same process as that of the driving circuit of the pixels PX (e.g., by a low temperature polycrystalline silicon (LTPS) process or a low temperature polycrystalline oxide (LTPO) process).

The data driver 200 may output data signals to the data lines DL. The data signals may be provided in the form of analog voltages whose levels are determined based on gradation levels of the image data.

In an embodiment, the data driver 200 may be mounted on a printed circuit board FPCB, and the printed circuit board FPCB may be connected to pads, which are disposed at ends of the data lines DL. However, the inventive concept is not limited to this example, and the data driver 200 may be directly mounted on the display panel DP without using the printed circuit board FPCB.

The scan lines SL may extend in the first direction DR1 and may be arranged in the second direction DR2. The scan lines SL may be used to deliver the scan signals to the pixels PX.

The emission control lines ECL may extend in the first direction DR1 and may be arranged in the second direction DR2. In other words, each of the emission control lines ECL may be arranged to be parallel to a corresponding one of the scan lines SL. The emission control lines ECL may be used to deliver the emission control signals to the pixels PX.

The data lines DL may extend in the second direction DR2 and may be arranged in the first direction DR1. The data lines DL may be used to deliver the data signals to corresponding ones of the pixels PX.

The power lines PL may extend in the second direction DR2 and may be arranged in the first direction DR1. The power lines PL may be used to provide a first power ELVDD to corresponding ones of the pixels PX.

Each of the pixels PX may be coupled to a corresponding one of the scan lines SL, a corresponding one of the emission control lines ECL, a corresponding one of the data lines DL and a corresponding one of the power lines PL.

A second power ELVSS may be provided to the pixels PX of the display panel DP.

Figure 6:
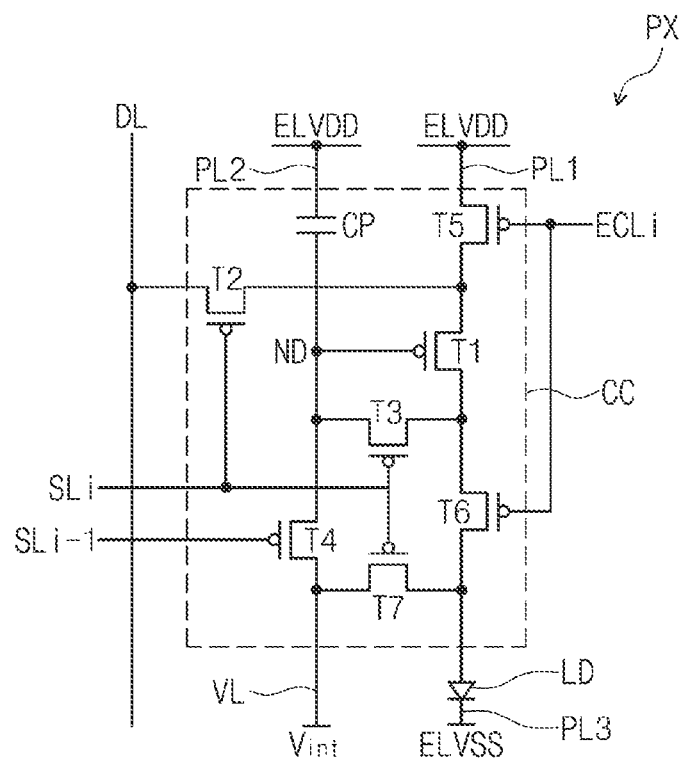
FIG. 6 is an equivalent circuit diagram of the pixel of FIG. 5.
Figure 7:
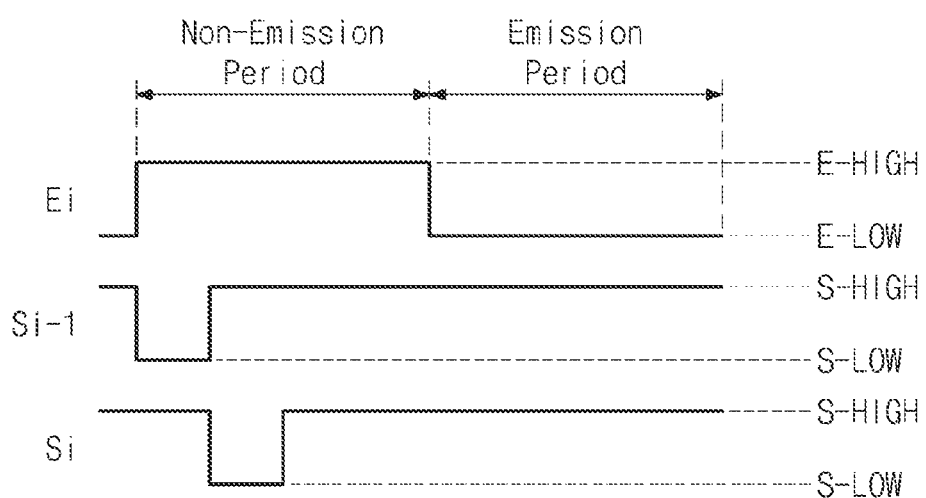
FIG. 7 is a diagram exemplarily illustrating an emission control signal and scan signals, which are applied to the pixel of FIG. 6.

FIG. 6 is an equivalent circuit diagram of a pixel PX according to an embodiment of the inventive concept. FIG. 7 illustrates an example of an emission control signal Ei and scan signals Si−1 and Si which are applied to the pixel PX of FIG. 6. FIG. 6 exemplarily illustrates the pixel PX connected to an (i−1)-th scan line SLi−1, an i-th scan line SLi and an i-th emission control line ECLi.

The pixel PX may include the emission element LD and the pixel circuit CC. The pixel circuit CC may include first to seventh transistors T1-T7 and a capacitor CP. The pixel circuit CC may control an amount of current flowing through the emission element LD in response to the data signal.

The emission element LD may emit light whose brightness is determined by an amount of current to be supplied from the pixel circuit CC. For this, an electric potential of the first power ELVDD may be set to be higher than an electric potential of the second power ELVSS.

Each of the first to seventh transistors T1-T7 may include an input or source electrode, an output or drain electrode, and a control or gate electrode. In the present specification, for convenience in description, one of the input and output electrodes may be referred to as "a first electrode", and the other may be referred to as "a second electrode".

The first electrode of the first transistor T1 may be coupled to the first power ELVDD through the fifth transistor T5, and the second electrode of the first transistor T1 may be coupled to an anode electrode of the emission element LD through the sixth transistor T6. In the present specification, the first transistor T1 may be referred to as "a driving transistor".

The first transistor T1 may control an amount of current flowing through the emission element LD in response to a voltage applied to the control electrode.

The second transistor T2 may be coupled between the data line DL and the first electrode of the first transistor T1. The control electrode of the second transistor T2 may be coupled to the i-th scan line SLi. If the i-th scan signal Si is provided to the i-th scan line SLi, the second transistor T2 may be turned on to electrically connect the data line DL to the first electrode of the first transistor T1.

The third transistor T3 may be coupled between the second electrode and the control electrode of the first transistor T1. The control electrode of the third transistor T3 may be coupled to the i-th scan line SLi. If the i-th scan signal Si is provided to the i-th scan line SLi, the third transistor T3 may be turned on to electrically connect the second electrode of the first transistor T1 and the control electrodes of the first transistor T1 to each other. Thus, if the third transistor T3 is turned on, the first transistor T1 may behave like a diode.

The fourth transistor T4 may be coupled between a node ND which is connected to the gate electrode of the first transistor T1 and an initialization power generator (not shown) which supplies an initialization voltage Vint. The control electrode of the fourth transistor T4 may be coupled to an (i−1)-th scan line SLi−1. If an (i−1)-th scan signal Si−1 is provided to the (i−1)-th scan line SLi−1, the fourth transistor T4 may be turned on to provide the initialization voltage Vint to the node ND.

The fifth transistor T5 may be coupled between a first power line PL1 and the first electrode of the first transistor T1. The control electrode of the fifth transistor T5 may be coupled to the i-th emission control line ECLi.

The sixth transistor T6 may be coupled between the second electrode of the first transistor T1 and the anode electrode of the emission element LD. The control electrode of the sixth transistor T6 may be coupled to the i-th emission control line ECLi.

The seventh transistor T7 may be coupled between the initialization power generator (not shown) which supplies an initialization voltage Vint and the anode electrode of the emission element LD. The control electrode of the seventh transistor T7 may be coupled to the i-th scan line SLi. If the i-th scan signal Si is provided to the i-th scan line SLi, the seventh transistor T7 may be turned on to provide the initialization voltage Vint to the anode electrode of the emission element LD.

The seventh transistor T7 may improve a black representation ability of the pixel PX. In detail, if the seventh transistor T7 is turned on, charges stored in a parasitic capacitor (not shown) of the emission element LD may be discharged. By discharging charges in the parasitic capacitor, it may be possible to prevent a leakage current from the first transistor T1 from causing light emission of the emission element LD when displaying a black image and thereby to improve the black representation ability of the pixel PX.

In addition, although FIG. 6 illustrates an example in which the control electrode of the seventh transistor T7 is coupled to the i-th scan line SLi, the inventive concept is not limited to this example. In certain embodiments, the control electrode of the seventh transistor T7 may be coupled to the (i−1)-th scan line SLi−1 or an (i+1)-th scan line SLi+1.

FIG. 6 illustrates an example in which PMOS transistors are used as the first to seventh transistors T1-T7, but the inventive concept is not limited to this example. In certain embodiments, NMOS transistors may be used to constitute the pixel PX. In other embodiments, the pixel PX may be configured to include not only NMOS transistors but also PMOS transistors.

The capacitor CP may be disposed between a second power line PL2 and the node ND. The capacitor CP may be charged to a voltage level corresponding to the data signal. If the fifth and sixth transistors T5 and T6 are turned on, an amount of current flowing through the first transistor T1 may be determined depending on a charged voltage level of the capacitor CP.

The inventive concept is not limited to the structure of the pixel PX shown in FIG. 6. In certain embodiments, the structure of the pixel PX may be variously altered to control a light emission operation of the emission element LD.

In an embodiment, the emission element LD may be an organic light emitting element, a micro LED, or an emission element using quantum dots.

Referring to FIG. 7, the emission control signal Ei may have a high level E-HIGH or a low level E-LOW. Each of the scan signals Si−1 and Si may have a high level S-HIGH or a low level S-LOW.

If the emission control signal Ei has the high level E-HIGH, the fifth transistor T5 and the sixth transistor T6 may be turned off. If the fifth transistor T5 is turned off, the first power line PL1 may be electrically disconnected from the first electrode of the first transistor T1. If the sixth transistor T6 is turned off, the second electrode of the first transistor T1 may be electrically disconnected from the anode electrode of the emission element LD. Thus, the emission element LD may not emit light during the time when the emission control signal Ei having the high level E-HIGH is applied to the i-th emission control line ECLi.

Thereafter, if the (i−1)-th scan signal Si−1 provided to the (i−1)-th scan line SLi−1 has the low level S-LOW, the fourth transistor T4 may be turned on. If the fourth transistor T4 is turned on, the initialization voltage Vint may be provided to the node ND.

If the i-th scan signal Si provided to the i-th scan line SLi has the low level S-LOW, the second transistor T2, the third transistor T3 and the seventh transistor T7 may be turned on.

If the second transistor T2 is turned on, the data signal may be provided to the first electrode of the first transistor T1. Here, since the node ND is initialized to the initialization voltage Vint, the first transistor T1 may be turned on. If the first transistor T1 is turned on, a voltage corresponding to the data signal may be provided to the node ND. Thus, the capacitor CP may be charged by the voltage corresponding to the data signal.

If the seventh transistor T7 is turned on, the initialization voltage Vint may be applied to the anode electrode of the emission element LD to discharge a parasitic capacitor of the emission element LD.

If the emission control signal Ei provided to the emission control line ECLi has the low level E-LOW, the fifth transistor T5 and the sixth transistor T6 may be turned on. If the fifth transistor T5 is turned on, the first power ELVDD may be provided to the first electrode of the first transistor T1. If the sixth transistor T6 is turned on, the second electrode of the first transistor T1 may be electrically coupled to the anode electrode of the emission element LD. In this case, the emission element LD may emit light, and brightness of the light emitted from the emission element LD may be determined by an amount of current provided to the emission element LD.

Figure 8:
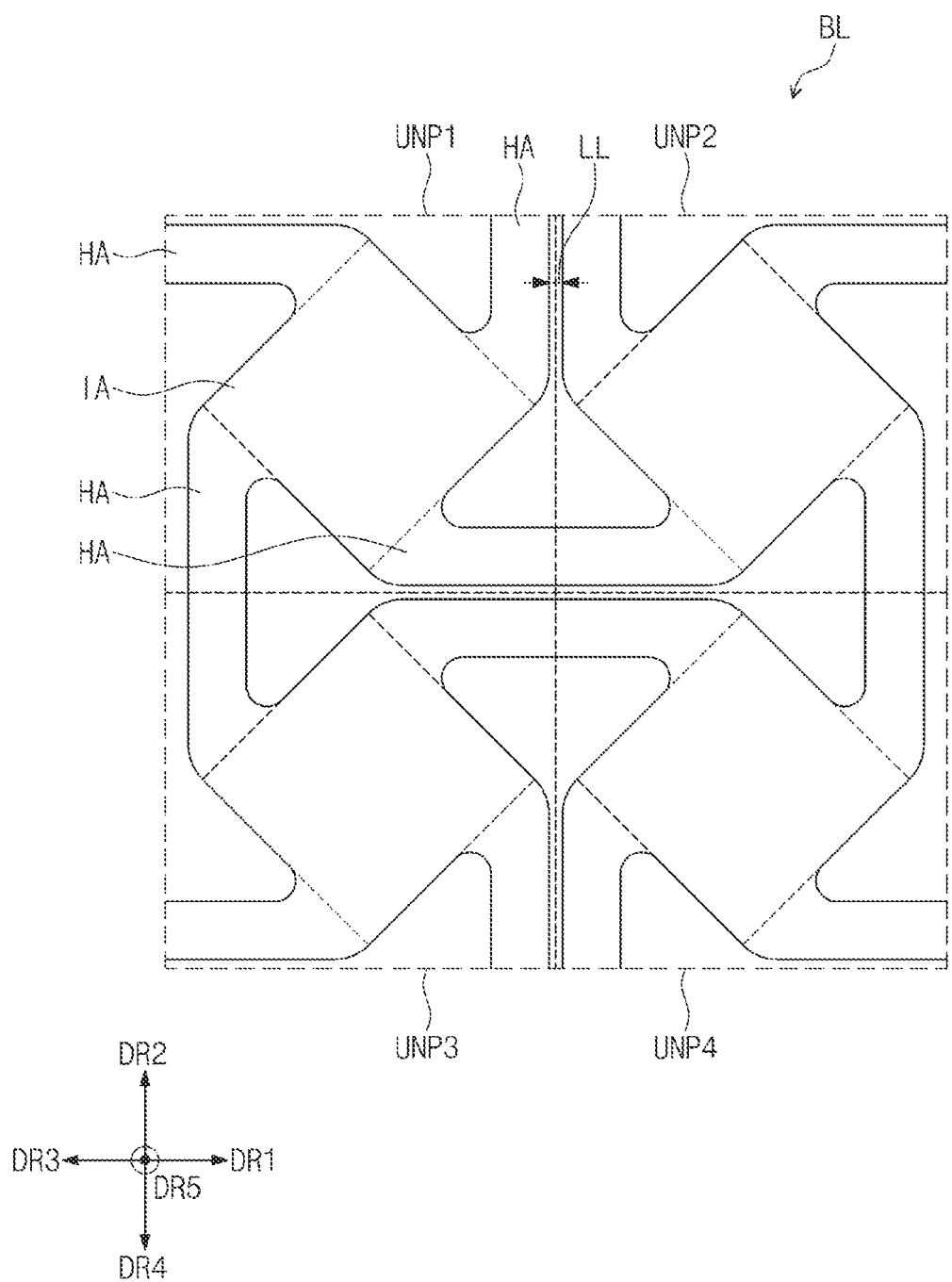
FIGS. 8 and 9 are diagrams, each of which illustrates an example of a portion of a base, on which the pixels shown in FIG. 6 are disposed.
Figure 9:
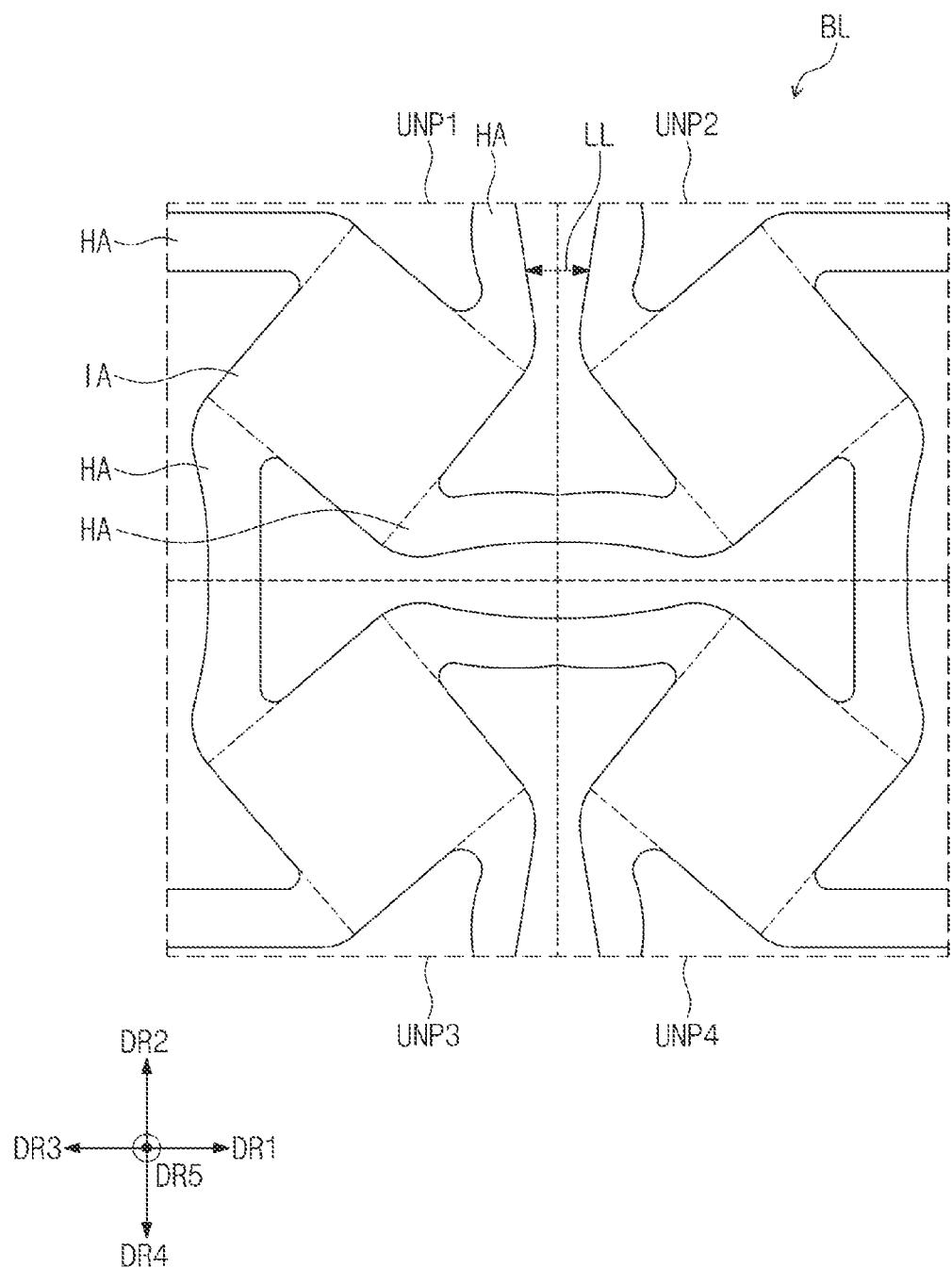

FIGS. 8 and 9 are diagrams, each of which illustrates an example of a portion of a base BL, on which the pixels PX shown in FIG. 6 are disposed. In detail, FIG. 8 illustrates an example of the shape of the base BL, when the display module DM is in the first state as shown in FIG. 1. FIG. 9 illustrates an example of the shape of the base BL, which the display module DM is in the second state as shown in FIG. 2.

The base BL may include a synthetic resin. For example, the base BL may include polyimide (PI).

The base BL may include a plurality of unit portions UNP1, UNP2, UNP3, and UNP4. Four unit portions are exemplarily illustrated in FIG. 8, but the four unit portions are just some of a plurality of unit portions provided in the base BL. In the present specification, the reference number 'UNP' may be used to refer to one of the unit portions UNP1, UNP2, UNP3, and UNP4.

Each of the unit portions UNP1, UNP2, UNP3, and UNP4 may include an island portion IA and a plurality of connecting portions HA. The plurality of connection portions HA may be referred to as a plurality of hinge portions. FIG. 8 illustrates an example, in which one unit portion UNP includes one island portion IA and four connecting portions HA, but the numbers of the island and connecting portions IA and HA in the unit portion UNP may be altered as required.

The island portion IA may be disposed in a center region of the unit portion UNP.

Each of the connecting portions HA may extend from the island portion IA. The connecting portions HA may be spaced apart from each other and may extend in different directions. FIG. 8 illustrates an example, in which each of the connecting portions HA extends in a corresponding one of the first to fourth directions DR1-DR4, but the inventive concept is not limited to this example. The extension direction of each of the connecting portions HA may be altered as required.

The unit portions UNP1, UNP2, UNP3, and UNP4 may be connected to each other by the connecting portions HA.

Referring to FIGS. 8 and 9, when the display module DM is changed from the first state to the second state, a distance LL between the connecting portions HA of two adjacent ones of the unit portions UNP1, UNP2, UNP3, and UNP4 may be increased.

In an embodiment, when the display module DM is changed from the first state to the second state, an angle between an edge of the island portion IA and the first direction DR1 may be changed.

In an embodiment, when the display module DM is changed from the first state to the second state, an angle between the edge of the island portion IA and at least one of the connecting portions HA may be changed.

As described above, because at least one of the distance LL between the connecting portions HA, the angle between the edge of the island portion IA and the first direction DR1, and the angle between the edge of the island portion IA and the connecting portion HA is changed, it may be possible to realize the stretchable display module DM that can be easily changed from the first state to the second state.

Figure 10A:
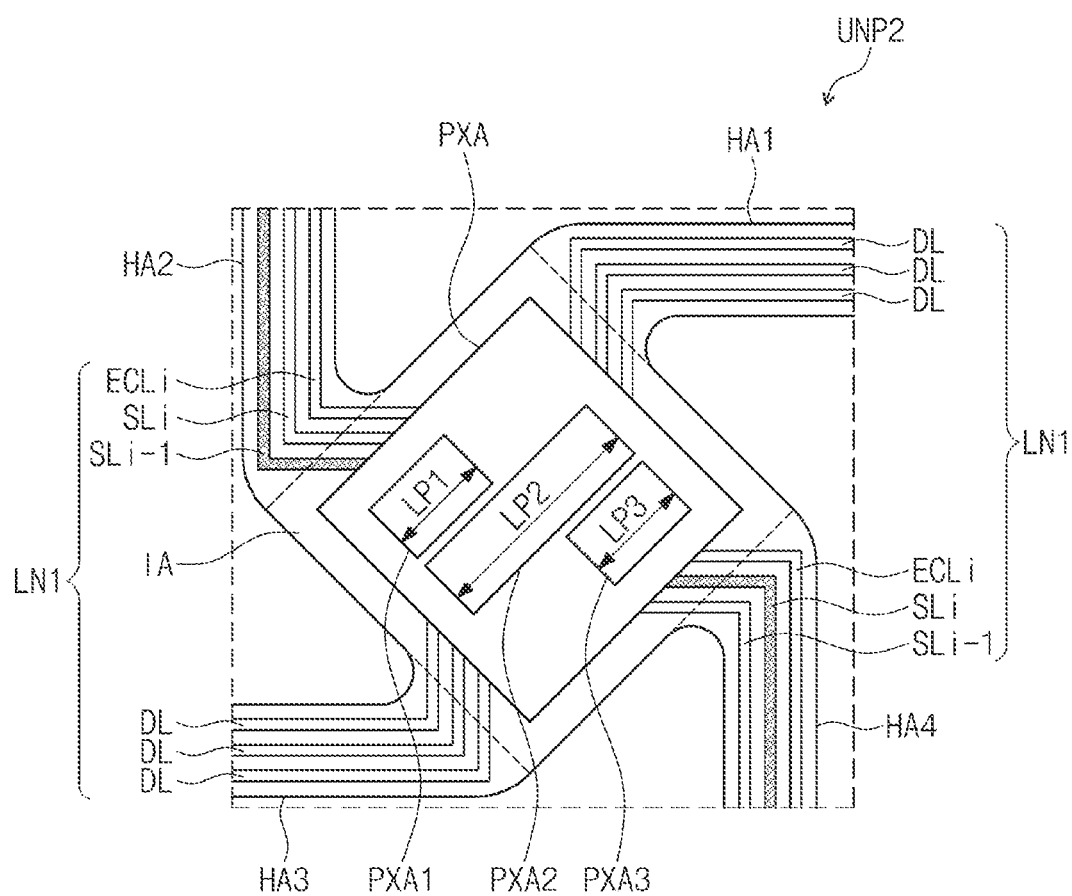
FIGS. 10A, 10B, and 10C are diagrams, each of which illustrates an example of line disposed on one of unit portions shown in FIG. 8.
Figure 10B:
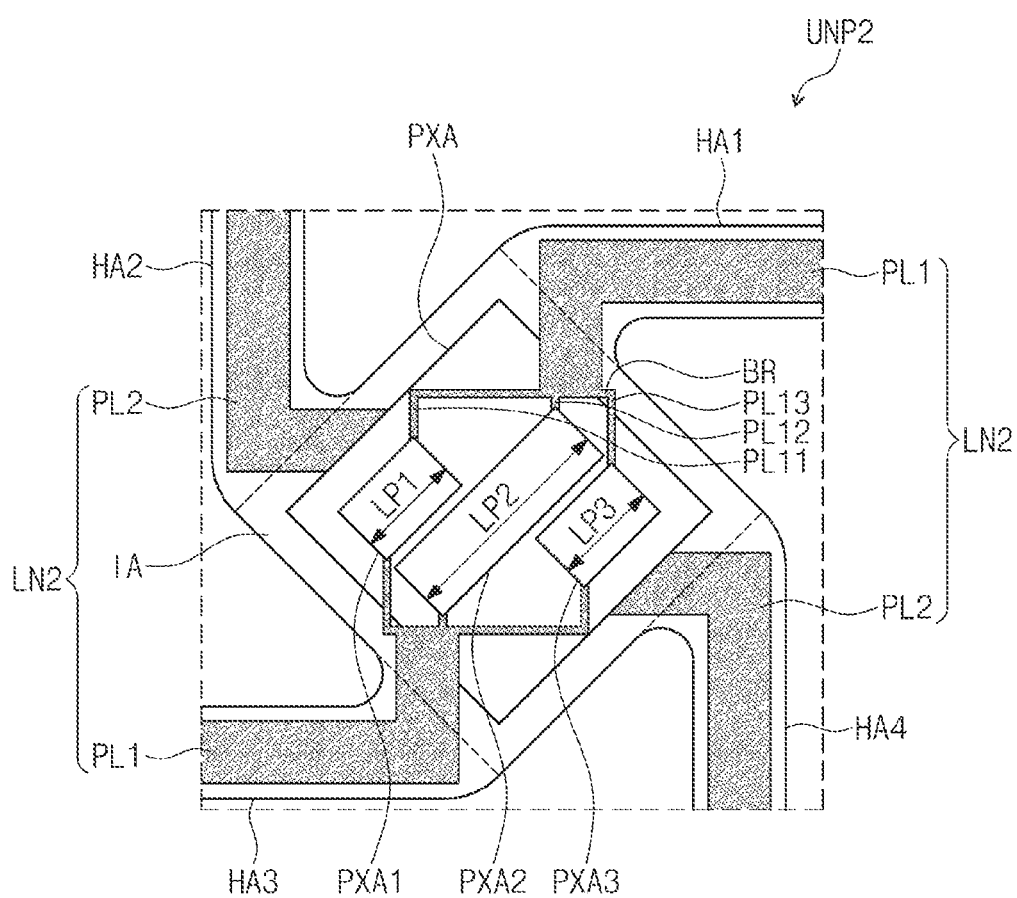
Figure 10B:
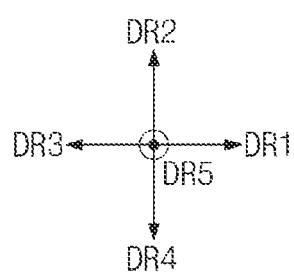
Figure 10C:
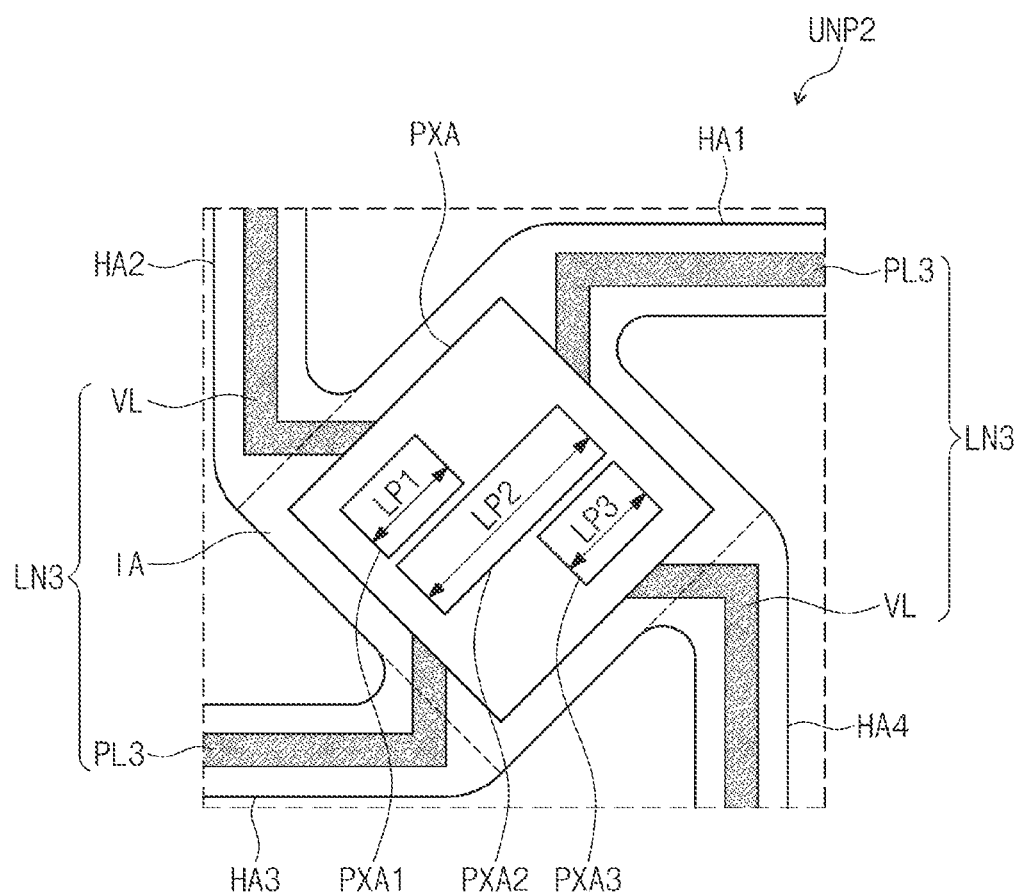
Figure 10C:
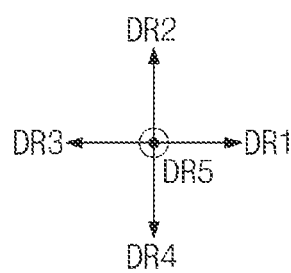

FIGS. 10A, 10B, and 10C are diagrams, each exemplarily illustrating interconnection lines LN1, LN2, and LN3 which are disposed on the second unit portion UNP2 among the unit portions UNP1, UNP2, UNP3, and UNP4 shown in FIG. 8.

In detail, FIG. 10A illustrates first lines LN1 disposed in a first layer, FIG. 10B illustrates second lines LN2 disposed in a second layer, and FIG. 10C illustrates third lines LN3 disposed in a third layer. In other words, the first to third lines LN1, LN2, and LN3 may be disposed in different planes.

A pixel region PXA may be disposed in the island portion IA. The pixel region PXA may be a region, in which transistors, capacitors, and emission elements constituting the plurality of pixels PX (e.g., see FIG. 6) are disposed.

The pixel region PXA may include a first pixel region PXA1, a second pixel region PXA2, and a third pixel region PXA3. The second pixel region PXA2 may be disposed adjacent to the first pixel region PXA1, and the third pixel region PXA3 may be disposed adjacent to the second pixel region PXA2. The second pixel region PXA2 may be disposed between the first pixel region PXA1 and the third pixel region PXA3.

Transistors, a capacitor, and an emission element for emitting light of a first color may be disposed in the first pixel region PXA1. In an embodiment, the first color may be red, but the inventive concept is not limited to this example.

Transistors, a capacitor, and an emission element for emitting light of a second color may be disposed in the second pixel region PXA2. In an embodiment, the second color may be blue, but the inventive concept is not limited to this example.

Transistors, a capacitor, and an emission element for emitting light of a third color may be provided in the third pixel region PXA3. In an embodiment, the third color may be green, but the inventive concept is not limited to this example.

Each of a length LP1 (hereinafter, a first length) of the first pixel region PXA1 measured in a specific direction, a length LP2 (hereinafter, a second length) of the second pixel region PXA2 measured in the specific direction, and a length LP3 (hereinafter, a third length) of the third pixel region PXA3 measured in the specific direction may be determined according to an anode electrode AE (e.g., see FIG. 11) of the emission element LD corresponding to the same. For example, if a length of the anode electrode AE (e.g., see FIG. 11) of the emission element LD is long, a length of a corresponding one of the first to third pixel regions PXA1, PXA2, and PXA3 may be long, whereas if the length of the anode electrode AE (e.g., see FIG. 11) is short, a length of a corresponding one of the first to third pixel regions PXA1, PXA2, and PXA3 may be short.

Referring to FIGS. 10A to 10C, the second length LP2 may be longer than the first length LP1 and the third length LP3. In other words, a length of the anode electrode AE (e.g., see FIG. 11) of the emission element LD disposed on the second pixel region PXA2 may be longer than a length of the anode electrode AE (e.g., see FIG. 11) of the emission element LD disposed on the first or third pixel region PXA1 or PXA3. In this case, even when the blue light emitted from the second pixel region PXA2 has an intensity lower than each of the red and green lights emitted from the first and third pixel regions PXA1 and PXA3, respectively, it may be possible to increase overall intensity of the blue light and consequently to reduce a difference in visibility between lights of different colors.

The connecting portions HA may include a first connecting portion HA1 which extends from the island portion IA in the first direction DR1, a second connecting portion HA2, which extends from the island portion IA in the second direction DR2, a third connecting portion HA3, which extends from the island portion IA in the third direction DR3, and a fourth connecting portion HA4, which extends from the island portion IA in the fourth direction DR4.

Referring to FIG. 10A, the first lines LN1, which are electrically connected to the transistors of the pixel region PXA, may be disposed on each of the connecting portions HA1-HA4.

Referring to FIGS. 5 and 6, the first lines LN1 may include the data lines DL, the scan lines SLi−1 and SLi, and the emission control line ECLi.

The data lines DL may be disposed on at least one of the first connecting portion HA1 or the third connecting portion HA3. The data lines DL may provide the data signals to respective transistors disposed on the first to third pixel regions PXA1-PXA3.

The scan lines SLi−1 and SLi and the emission control line ECLi may be disposed on at least one of the second connecting portion HA2 or the fourth connecting portion HA4.

Referring to FIG. 10B, the second lines LN2, which are electrically connected to the transistors or the capacitor of the pixel region PXA, may be disposed on each of the connecting portions HA1-HA4.

Referring to FIGS. 5 and 6, the second lines LN2 may include a first power line PL1 and a second power line PL2.

The first power line PL1 may be disposed on at least one of the first connecting portion HA1 or the third connecting portion HA3 and may be electrically connected to the fifth transistor T5 of the pixel PX. The second power line PL2 may be disposed on at least one of the second connecting portion HA2 or the fourth connecting portion HA4 and may be electrically connected to the capacitor CP of the pixel PX.

In an embodiment, the first power line PL1 may include a branch line BR, a first supplying line PL11, a second supplying line PL12, and a third supplying line PL13 which are disposed in the pixel region PXA. The first supplying line PL11 may provide the first power ELVDD to the first pixel region PXA1, the second supplying line PL12 may provide the first power ELVDD to the second pixel region PXA2 and the third supplying line PL13 may provide the first power ELVDD to the third pixel region PXA3. According to a desired structure of the device, the second power line PL2 may supply the first power ELVDD to the first to third pixel regions PXA1, PXA2, and PXA3, in a different direction from that of the first to third supplying lines PL11, PL12, and PL13. In this case, each of the first to third pixel regions PXA1, PXA2, and PXA3 may be supplied with the first power ELVDD through a mesh-shaped structure.

FIG. 10B illustrates an example, in which the branch line BR is disposed in the same layer as the first to third supplying lines PL11, PL12, and PL13, but the inventive concept is not limited to this example. In certain embodiments, the branch line BR may be disposed in a different layer from the first to third supplying lines PL11, PL12, and PL13.

In an embodiment, the first power ELVDD, which is supplied to the pixel PX through the first power line PL1 and the second power line PL2, may have an electric potential from about 4.5V to about 5.5V, but the inventive concept is not limited to this example.

Referring to FIG. 10C, the third lines LN3, which are electrically connected to the transistors of the pixel region PXA, may be disposed on each of the connecting portions HA.

Referring to FIGS. 5 and 6, the third lines LN3 may include a third power line PL3 and an initializing power line VL. The third power line PL3 may be disposed on at least one of the first connecting portion HA1 or the third connecting portion HA3 and may be electrically connected to a cathode electrode CE (e.g., see FIG. 11) of the emission element LD. The initializing power line VL may be disposed on at least one of the second connecting portion HA2 or the fourth connecting portion HA4 and may be electrically connected to the fourth transistor T4 and the seventh transistor T7 of the pixel PX.

In an embodiment, the second power ELVSS, which is supplied to the pixel PX through the third power line PL3, may have an electric potential from about −5.5V to about −4.5V, but the inventive concept is not limited to this example.

In an embodiment, the initializing power line VL may provide an electrical signal, whose electric potential ranges from about −4.5V to about −3.5V, to the pixel PX, but the inventive concept is not limited to this example.

The initializing power line VL may provide an electrical signal, whose electric potential is similar to that of the third power line PL3, to the pixel PX. By disposing the initializing power line VL and the third power line PL3, which provide electrical signals with a similar electric potential, in the same layer, it may be possible to improve electric stability.

Because the second lines LN2 include the first power line PL1 and the second power line PL2, the second lines LN2 may provide the first power ELVDD, which is required for light emission operation of the emission element LD, to the pixel PX. Preferably, the second lines LN2 has to transmit electrical power greater than that of the first lines LN1 and the third lines LN3 to the pixel, each of the second lines LN2 on the connecting portions HA may have a width larger than that of the first and third lines LN1 and LN3.

FIGS. 11, 12, 13A, and 13B are diagrams, each of which illustrates a sectional structure of a portion of the display panel DP according to an example embodiment of the inventive concept.

Figure 11:
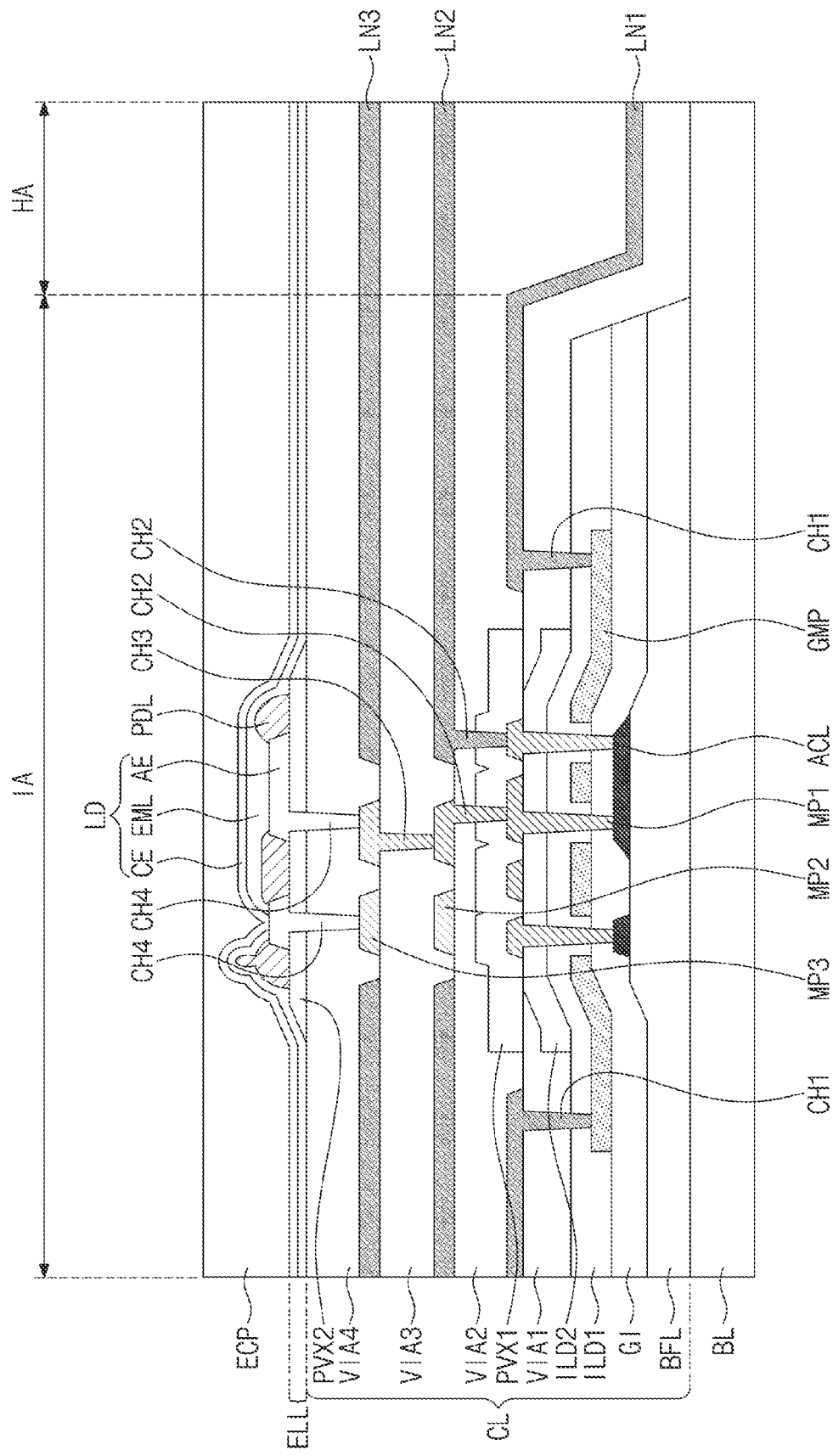
FIGS. 11, 12, 13A, and 13B are diagrams, each of which illustrates a sectional structure of a portion of a display panel according to an example embodiment of the inventive concept.

FIG. 11 exemplarily illustrates a vertical section corresponding to a portion of the island portion IA of the display panel DP and a portion of the connecting portion HA.

The display panel DP may include a base BL, a circuit layer CL, an emission element layer ELL, and an encapsulation layer ECP.

The circuit layer CL may be disposed on the base BL.

The circuit layer CL may include an active pattern ACL, gate metal patterns GMP, MP1, MP2, and MP3, the first to third LN1, LN2, and LN3, a buffer layer BFL, a gate insulating layer GI, first and second interlayer insulating layers ILD1 and ILD2, first and second passivation layers PVX1 and PVX2, and first to fourth circuit insulating layers VIA1, VIA2, VIA3, and VIA4. Each of the first to fourth circuit insulating layers VIA1, VIA2, VIA3, and VIA4 may include an organic material or an inorganic material.

The buffer layer BFL may be disposed on the base BL. The buffer layer BFL may be overlapped with the island portion IA.

The buffer layer BFL may prevent impurities in the base BL from entering the pixel PX during a fabrication process. In particular, the buffer layer BFL may prevent the impurities from being diffused into the active patterns ACL of the first to seventh transistors T1-T7 constituting the pixel PX.

The impurities may be supplied from the outside or may be produced when the base BL is heated. The impurities may be gas or sodium exhausted from the base BL. In addition, the buffer layer BFL may prevent external moisture from entering into the pixel PX.

The active pattern ACL may be disposed on the buffer layer BFL. The active pattern ACL may constitute each of the first to seventh transistors T1-T7. The active pattern ACL may include at least one of poly silicon, amorphous silicon, or metal oxide semiconductor materials.

The active pattern ACL may include a channel region, which is used as a conduction path for electrons or holes, and first and second doped regions, which are spaced apart from each other with the channel region interposed therebetween.

The gate insulating layer GI may be disposed on the buffer layer BFL to cover the active pattern ACL. The gate insulating layer GI may include an organic layer and/or an inorganic layer. In an embodiment, the gate insulating layer GI may include a single layer of an inorganic thin film or multi-layers which includes a plurality of inorganic thin films. The plurality of inorganic thin films may include a silicon nitride layer and a silicon oxide layer.

The gate metal pattern GMP may be disposed on the gate insulating layer GI. The gate metal pattern GMP may constitute the control electrodes of the first to seventh transistors T1-T7. In an embodiment, the gate metal pattern GMP may further constitute one of two electrodes of the capacitor CP of the pixel PX.

In an embodiment, the gate metal pattern GMP may include molybdenum (Mo), but the inventive concept is not limited to this example.

The first interlayer insulating layer ILD1 may be disposed on the gate metal pattern GMP. The first interlayer insulating layer ILD1 may be overlapped with the island portion IA.

The second interlayer insulating layer ILD2 may be disposed on the first interlayer insulating layer ILD1. The second interlayer insulating layer ILD2 may be overlapped with the gate metal pattern GMP.

The first interlayer insulating layer ILD1 and the second interlayer insulating layer ILD2 may include an organic layer and/or an inorganic layer. Each of the first interlayer insulating layer ILD1 and the second interlayer insulating layer ILD2 may include a single layer inorganic thin film or multi-layer inorganic thin film which includes a plurality of inorganic thin films. The plurality of inorganic thin films may include a silicon nitride layer and a silicon oxide layer.

The first circuit insulating layer VIA1 may be disposed on at least a portion of the first interlayer insulating layer ILD1 and at least a portion of the second interlayer insulating layer ILD2. The first circuit insulating layer VIA1 may expose a portion of the second interlayer insulating layer ILD2. The first circuit insulating layer VIA1 may be overlapped with at least a portion of the island portion IA and at least a portion of the connecting portion HA.

First contact holes CH1 may be defined in the first circuit insulating layer VIA1 and the first interlayer insulating layer ILD1.

The first metal pattern MP1 may be disposed on the second interlayer insulating layer ILD2 or the first circuit insulating layer VIAL The first metal pattern MP1 may be overlapped with the island portion IA.

The first metal pattern MP1 may constitute the input and output electrodes of the first to seventh transistors T1-T7.

The first metal pattern MP1 may constitute the other electrode of the two electrodes constituting the capacitor CP (e.g., see FIG. 6). In other words, a portion of the gate metal pattern GMP and a portion of the first metal pattern MP1 may be overlapped to each other to form the capacitor CP of FIG. 6. However, the structure of electrodes constituting the capacitor CP may not limited to this example.

The first line LN1 may be disposed on the first circuit insulating layer VIAL The first line LN1 may be electrically connected to the gate metal pattern GMP through the first contact hole CH1 formed in the first circuit insulating layer VIA1 and the first interlayer insulating layer ILD1.

The first metal pattern MP1 and the first line LN1 may include at least one of aluminum (Al) or titanium (Ti), but the inventive concept is not limited to this example. In an embodiment, the first metal pattern MP1 or the first line LN1 may have a structure, in which titanium, aluminum, and titanium layers are sequentially stacked.

Conventionally, an elongation of each of aluminum and titanium may be greater than that of molybdenum. In other words, the aluminum and the titanium may be more extensible or ductile than the molybdenum.

A first metal material, which is included in the gate metal pattern GMP, or a second metal material, which is included in each of the first metal pattern MP1 and the first line LN1, may not be limited to specific materials, as long as an elongation of the second metal material is greater than that of the first metal material.

In an embodiment, to provide an electrical signal to the gate metal pattern GMP, a metal material, whose elongation is higher than that of the gate metal pattern GMP, may be used for the first line LN1. Thus, it may be possible to stably provide the electrical signal to the gate metal pattern GMP, even deformation has occurred in the connecting portion HA in a step of changing the display module DM from the first state to the second state.

The first passivation layer PVX1 may be disposed on the second interlayer insulating layer ILD2 to cover the first metal pattern MP1. The first passivation layer PVX1 may include an organic material and/or an inorganic material.

The second circuit insulating layer VIA2 may be disposed on the first circuit insulating layer VIA1 to cover the first metal pattern MP1, the first line LN1, and the first passivation layer PVX1.

Second contact holes CH2 may be defined in the second circuit insulating layer VIA2 and the first passivation layer PVX1.

The second metal pattern MP2 may be disposed on the second circuit insulating layer VIA2. The second metal pattern MP2 may be overlapped with the island portion IA.

The second line LN2 may be disposed on the second circuit insulating layer VIA2. The second line LN2 may be overlapped with the connecting portion HA.

The second metal pattern MP2 may be electrically connected to the first metal pattern MP1 through one of the second contact holes CH2 of the second circuit insulating layer VIA2 and the first passivation layer PVX1, and the second line LN2 may be electrically connected to the first metal pattern MP1 through another one of the second contact holes CH2 of the second circuit insulating layer VIA2 and the first passivation layer PVX1.

The second metal pattern MP2 and the second line LN2 may include at least one of aluminum (Al) or titanium (Ti), but the inventive concept is not limited to this example. In an embodiment, the second metal pattern MP2 or the second line LN2 may have a structure, in which titanium, aluminum, and titanium layers are sequentially stacked.

The third circuit insulating layer VIA3 may be disposed on the second circuit insulating layer VIA2 to cover the second metal pattern MP2 and the second line LN2.

A third contact hole CH3 may be defined in the third circuit insulating layer VIA3. The third metal pattern MP3 may be disposed on the third circuit insulating layer VIA3. The third metal pattern MP3 may be overlapped with the island portion IA.

The third line LN3 may be disposed on the third circuit insulating layer VIA3. The third line LN3 may be overlapped with the connecting portion HA.

The third metal pattern MP3 may be electrically connected to the second metal pattern MP2 via the third contact hole CH3 of the third circuit insulating layer VIA3.

The third metal pattern MP3 and the third line LN3 may include at least one of aluminum (Al) or titanium (Ti), but the inventive concept is not limited to this example. In an embodiment, the third metal pattern MP3 or the third line LN3 may have a structure, in which titanium, aluminum, and titanium layers are sequentially stacked.

The fourth circuit insulating layer VIA4 may be disposed on the third circuit insulating layer VIA3 to cover the third metal pattern MP3 and the third line LN3.

The second passivation layer PVX2 may be disposed on the fourth circuit insulating layer VIA4.

Fourth contact holes CH4 may be defined in the fourth circuit insulating layer VIA4 and the second passivation layer PVX2.

In an embodiment, the fourth circuit insulating layer VIA4 may be made of a material which has a light shielding property, for example, photo resist with black pigment. Since the fourth circuit insulating layer VIA4, which is the uppermost layer of the circuit layer CL, is black, elements disposed below the fourth circuit insulating layer VIA4 may not be recognized by a user of the display module DM. This may make it possible to improve the aesthetic and quality characteristics of the display module DM.

The emission element layer ELL may include the emission element LD and a pixel definition layer PDL. The emission element LD may include an anode electrode AE, an emission layer EML and a cathode electrode CE.

The anode electrode AE may be disposed on the second passivation layer PVX2. The anode electrode AE may be electrically connected to the third metal pattern MP3 through the fourth contact hole CH4 of the second passivation layer PVX2 and the fourth circuit insulating layer VIA4. The first power ELVDD which is modified by the circuit layer CL according to a data signal is provided to the anode electrode AE through the second line LN2 and the first to third metal patterns MP1, MP2, and MP3.

The pixel definition layer PDL may be disposed on the second passivation layer PVX2 to expose at least a portion of the anode electrode AE.

The emission layer EML may be disposed on the anode electrode AE.

In the case where the emission element LD is an organic light emitting diode (OLED), the emission layer EML may include an organic material. In the case where the emission element LD is a micro LED, the emission layer EML may include an inorganic material.

The cathode electrode CE may be disposed on the emission layer EML. The cathode electrode CE may be electrically connected to the third metal pattern MP3 through the fourth contact hole CH4 of the fourth circuit insulating layer VIA4 and the second passivation layer PVX2. The cathode electrode CE may receive the second power ELVSS, which is provided from the third line LN3 and is delivered through the third metal pattern MP3.

The encapsulation layer ECP may seal or encapsulate the emission element layer ELL to protect the emission element layer ELL from external oxygen or moisture. The encapsulation layer ECP may be a layer, in which an organic layer and an inorganic layer are alternately stacked.

Figure 12:
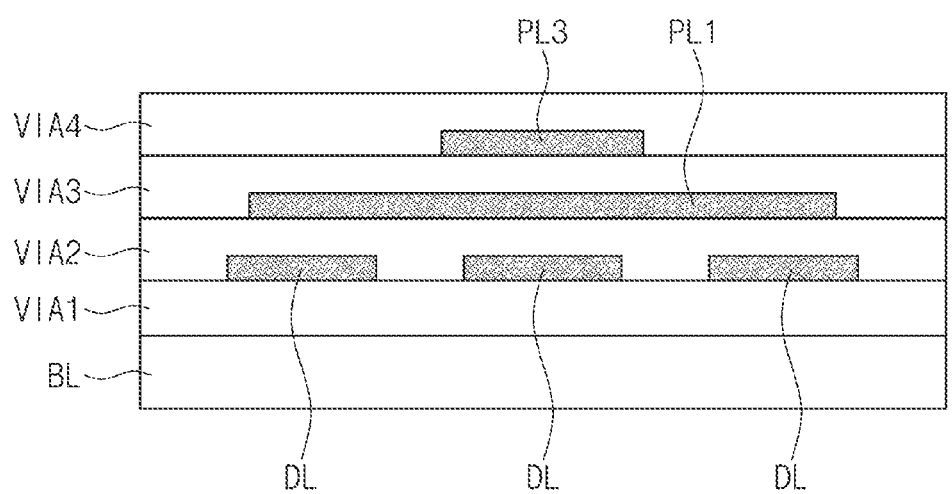

FIG. 12 exemplarily illustrates a vertical section of a portion of the display panel DP corresponding to the first connecting portion HA1 or the third connecting portion HA3 in FIGS. 10A to 10C.

The data lines DL may be disposed on the first circuit insulating layer VIA1, the first power line PL1 may be disposed on the second circuit insulating layer VIA2, and the third power line PL3 may be disposed on the third circuit insulating layer VIA3.

The first power line PL1 may be overlapped with a plurality of the data lines DL. An example, in which the first power line PL1 is overlapped with three data lines DL, is illustrated in FIG. 12. In certain embodiments, the first power line PL1 may be overlapped with two data lines DL.

The third power line PL3 may be overlapped with the first power line PL1 and may also be overlapped with at least one of the data lines DL. The third power line PL3 may be completely overlapped with the first power line PL1.

Figure 13A:
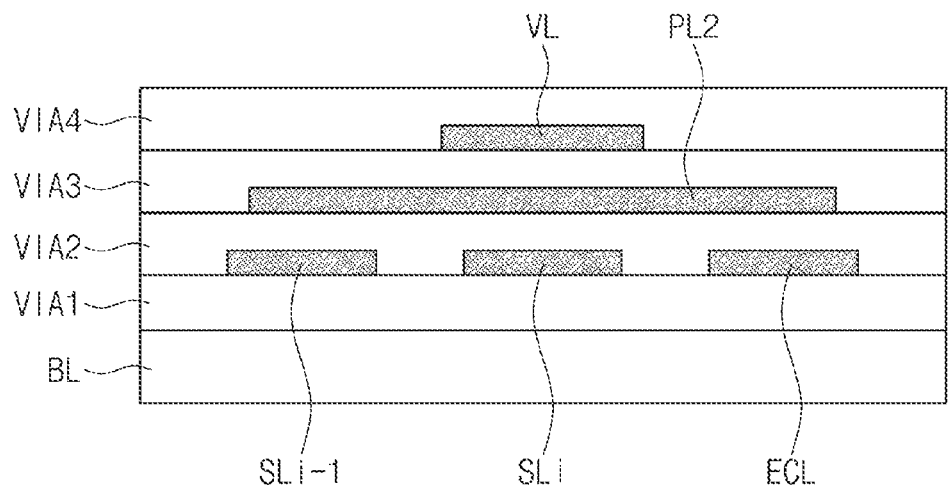
Figure 13B:
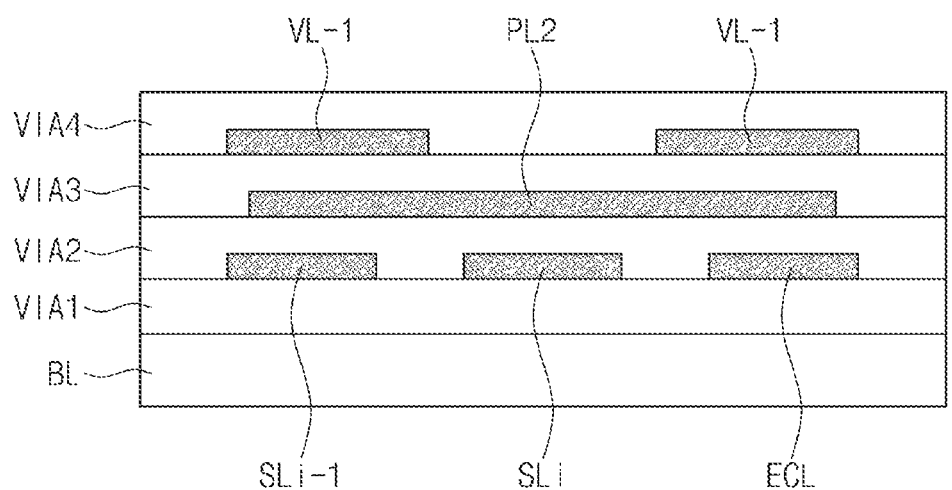

Each of FIGS. 13A and 13B exemplarily illustrates a vertical section of a portion of the display panel DP corresponding to the second connecting portion HA2 or the fourth connecting portion HA4 in FIGS. 10A to 10C.

Referring to FIG. 13A, the scan lines SLi and SLi−1 and an emission control line ECL may be disposed on the first circuit insulating layer VIA1, the second power line PL2 may be disposed on the second circuit insulating layer VIA2, and the initializing power line VL may be disposed on the third circuit insulating layer VIA3.

The second power line PL2 may be overlapped with the scan lines SLi and SLi−1 and the emission control line ECL. FIG. 13A illustrates an example, in which the second power line PL2 is overlapped with all of the scan lines SLi and SLi−1 and the emission control line ECL. In certain embodiments, the second power line PL2 may be overlapped with only the scan lines SLi and SLi−1 or may be overlapped with only the emission control line ECL and one of the scan lines SLi and SLi−1. The second power line PL2 may be overlapped with at least two of a scan line SLi, a scan line SLi−1 or the emission control line ECL.

The initializing power line VL may be overlapped with the second power line PL2 and may be overlapped with at least one of the scan lines SLi and SLi−1 or the emission control line ECL.

Referring to FIG. 13B, two initializing power lines VL-1 may be disposed on the third circuit insulating layer VIA3. One of the initializing power lines VL-1 may be connected to the fourth transistor T4 (e.g., see FIG. 6), and the other may be connected to the seventh transistor T7 (e.g., see FIG. 6). Except for these structural features, the structure of FIG. 13B may substantially the same as that described with reference to FIG. 13A, and thus a detailed description thereof will be omitted.

Figure 14:
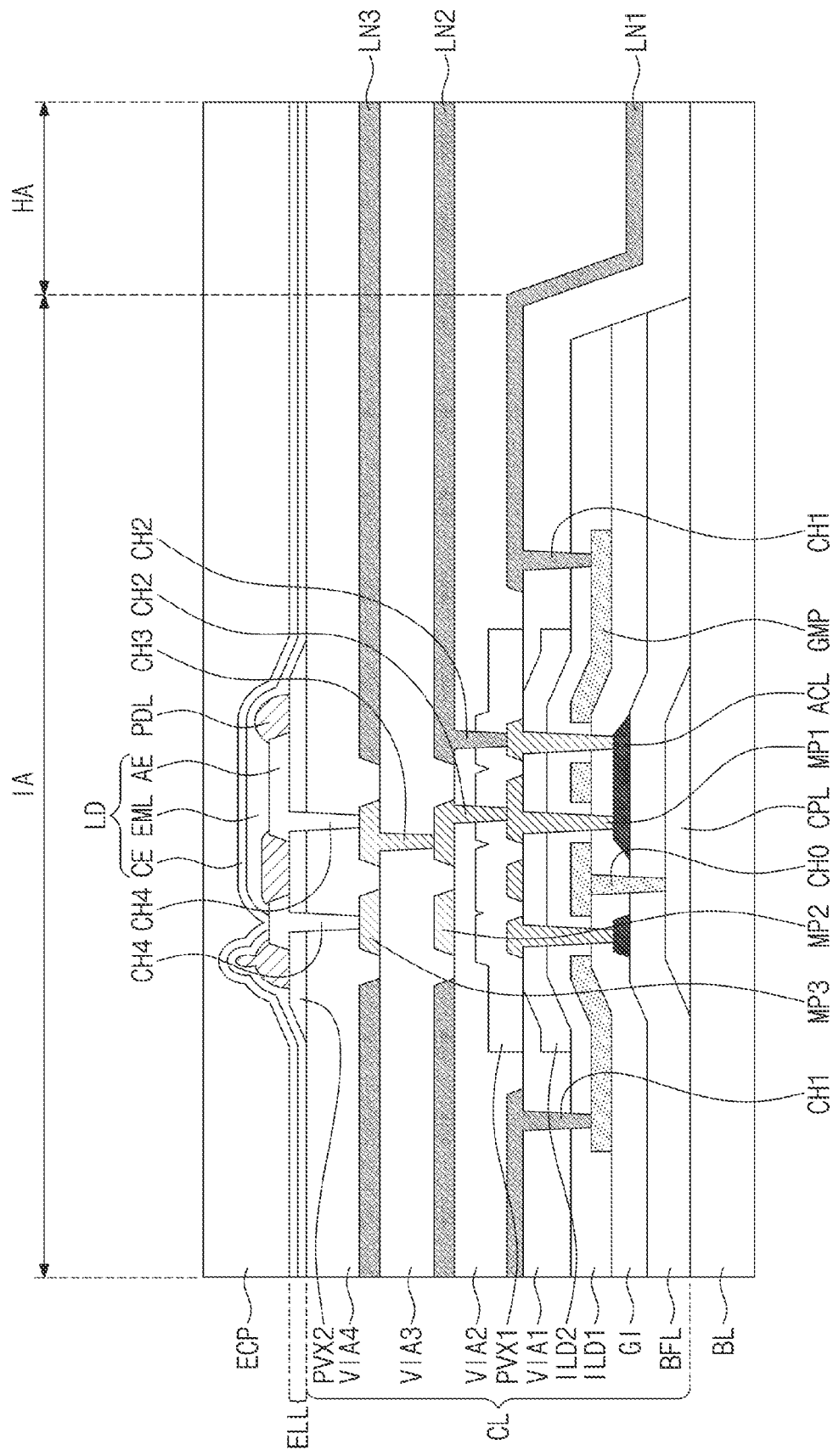
FIG. 14 is a sectional view exemplarily illustrating a portion of a display panel according to an example embodiment of the inventive concept.

FIG. 14 is a sectional view exemplarily illustrating a portion of the display panel DP according to an example embodiment of the inventive concept.

Referring to FIG. 14, the display panel DP may further include a protection layer CPL disposed between the buffer layer BFL and the base BL. The protection layer CPL may be overlapped with the active pattern ACL.

The protection layer CPL may be electrically connected to the gate metal pattern GMP through a contact hole CH0, which is defined in the gate insulating layer GI and the buffer layer BFL. However, the inventive concept is not limited to this example, and the protection layer CPL may be electrically connected to one of the first to third metal patterns MP1, MP2, or MP3 or may be in a floating state.

Figure 15:
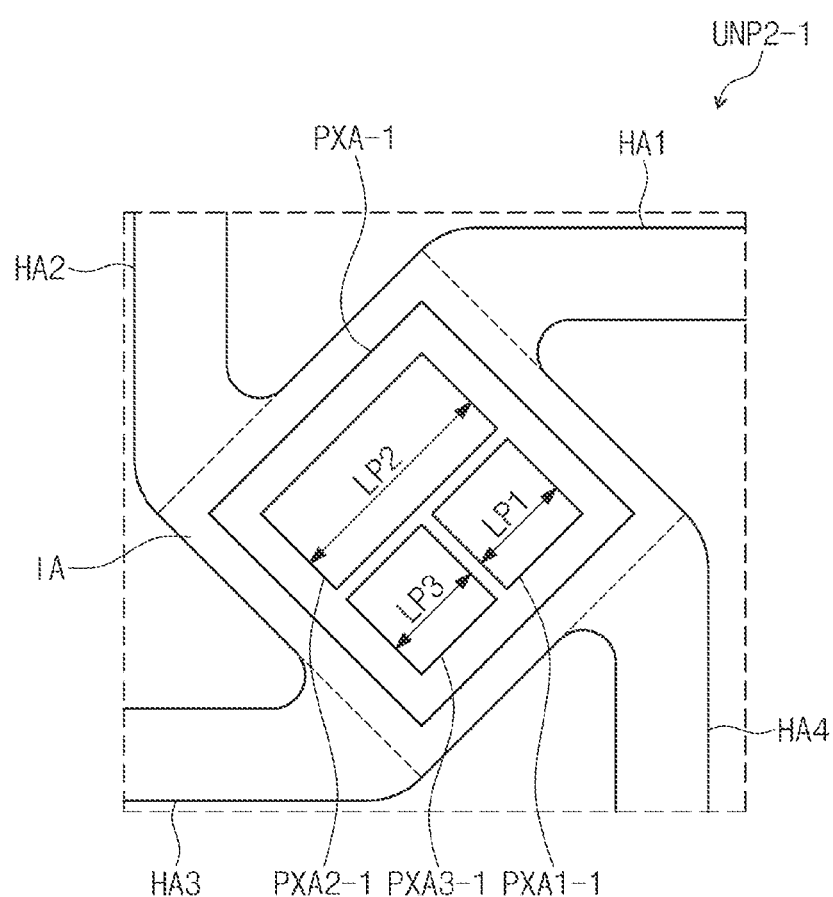
FIG. 15 is a diagram exemplarily illustrating one of unit portions according to an example embodiment of the inventive concept.
Figure 15:
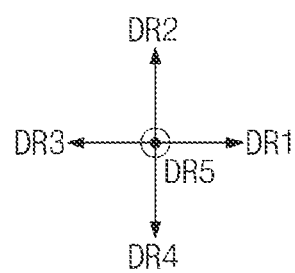

FIG. 15 is a diagram exemplarily illustrating a unit portion UNP2-1 according to an example embodiment of the inventive concept. In detail, the second unit portion UNP2-1 illustrated in FIG. 15 may be different from the second unit portion UNP2 shown in FIG. 8 in an arrangement of the first pixel region PXA1-1, a second pixel region PXA2-1 and a third the third pixel region PXA3-1. For convenience in illustration, the interconnection lines LN1, LN2, and LN3 are not illustrated in FIG. 15.

A pixel region PXA-1 may be disposed in the island portion IA and may include a first pixel region PXA1-1, a second pixel region PXA2-1, and a third pixel region PXA3-1.

The second pixel region PXA2-1 may be disposed adjacent to the first pixel region PXA1-1 and the third pixel region PXA3-1.

The second pixel region PXA2-1 may be used to display a blue light, and in this case, the second pixel region PXA2-1 may be provided to have an area larger than those of the first and third pixel regions PXA1-1 and PXA3-1 emitting red and green lights, respectively. Thus, a second length LP2 of the second pixel region PXA2-1 measured in a specific direction may be longer than a first length LP1 of the first pixel region PXA1-1 and a third length LP3 of the third pixel region PXA3-1, which are measured in the specific direction.

Figure 16:
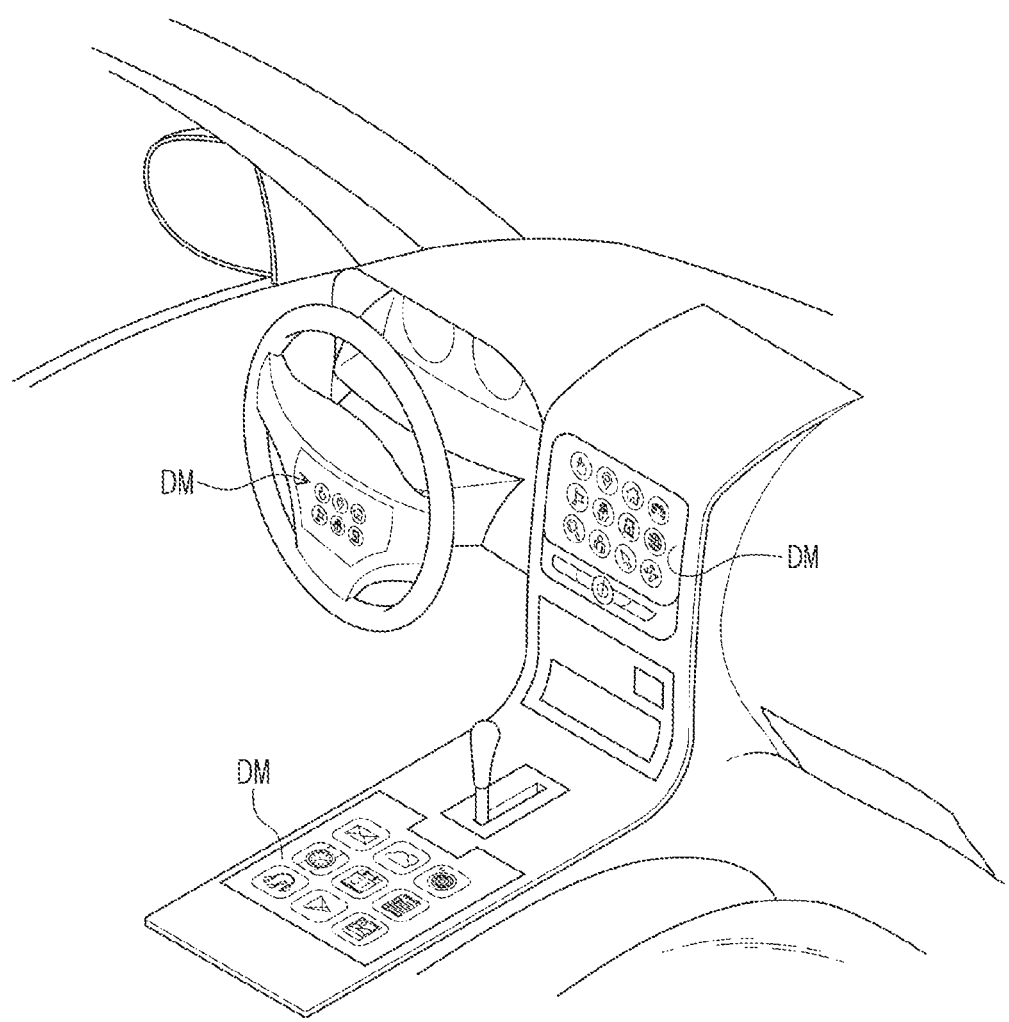
FIG. 16 is a diagram illustrating an example, in which display modules according to an example embodiment of the inventive concept are provided as parts of a vehicle.

FIG. 16 is a diagram illustrating an example, in which the display modules DM according to an example embodiment of the inventive concept are provided as parts of a vehicle. Each of the display modules DM may be mounted as a center fascia, a handle, or a dashboard of a vehicle or car.

According to an embodiment of the inventive concept, the display module DM may be easily stretched or extended by a force exerted thereon, and thus, the display module DM may be easily mounted on a curved portion, such as an internal part of a vehicle or car.

According to an embodiment of the inventive concept, line, which are used to deliver electric signals to pixels, may be disposed to be vertically overlapped with each other, and in this case, it may be possible to reduce a stress, which is applied to the line when a display module is stretched.

According to an embodiment of the inventive concept, line, which are used to deliver electric signals to pixels, may be formed of a highly flexible material, and thus, it may be possible to prevent the line from being damaged when a display module is stretched.

Thus, it may be possible to prove a stretchable display module with high reliability.

While example embodiments of the inventive concepts have been particularly shown and described, it will be understood by one of ordinary skill in the art that variations in form and detail may be made therein without departing from the spirit and scope of the attached claims.

What is claimed is:

1. A display module, comprising:
a base including a plurality of unit portions, each of the plurality of unit portions including a first portion and a plurality of second portions extending from the first portion and connecting adjacent first portions;
a gate pattern overlapped with the first portion, the gate pattern not extending over the plurality of second portions;
a first insulating layer disposed on the base to cover the gate pattern, the first insulating layer being overlapped with the first portion and the plurality of second portions and comprising a first contact hole defined therein;
a plurality of first lines which are disposed on the first insulating layer, each of the plurality of first lines being overlapped with at least one of the plurality of second portions, and at least one of the plurality of first lines being electrically connected to the gate pattern through the first contact hole;
a second insulating layer disposed on the plurality of first lines;
a plurality of second lines which are disposed on the second insulating layer, each of the plurality of second lines being overlapped with at least one of the plurality of second portions;
a third insulating layer disposed on the plurality of second lines; and
a plurality of third lines which are disposed on the third insulating layer, each of the plurality of third lines being overlapped with at least one of the plurality of second portions,
wherein the gate pattern comprises a first conductive material and each of the plurality of first lines, the plurality of second lines, and the plurality of third lines comprises a conductive material different from the first conductive material.

2. The display module of claim 1, wherein at least one of the plurality of second portions, at least one of the plurality of first lines, at least one of the plurality of second lines, and at least one of the plurality of third lines are overlapped with each other.

3. The display module of claim 2, wherein, when viewed in a plan view, a width of each of the plurality of second lines is larger than a width of each of the plurality of first lines and a width of each of the plurality of third lines.

4. The display module of claim 3, wherein at least one of the plurality of second lines is overlapped with at least two adjacent first lines of the plurality of first lines.

5. The display module of claim 4, wherein the first conductive material has a first elongation and the second conductive material has a second elongation greater than the first elongation.

6. The display module of claim 1, further comprising:
a first metal pattern disposed on the first insulating layer and overlapped with the first portion;
a second metal pattern disposed on the second insulating layer and overlapped with the first portion; and
a third metal pattern disposed on the third insulating layer and overlapped with the first portion.

7. The display module of claim 6, wherein the second insulating layer comprises a plurality of second contact holes defined therein, the second metal pattern is electrically connected to the first metal pattern through one of the plurality of second contact holes, and at least one of the plurality of second lines is electrically connected to the first metal pattern through another of the plurality of second contact holes.

8. The display module of claim 7, wherein the third insulating layer comprises a third contact hole defined therein and the third metal pattern is electrically connected to the second metal pattern through the third contact hole.

9. The display module of claim 6, further comprising:
a fourth insulating layer disposed on the third metal pattern and the plurality of third lines;
an anode electrode disposed on the fourth insulating layer;
an emission layer disposed on the anode electrode; and
a cathode electrode disposed on the emission layer.

10. The display module of claim 9, wherein the fourth insulating layer comprises a fourth contact hole defined therein and the anode electrode is electrically connected to the third metal pattern through the fourth contact hole.

11. The display module of claim 9, wherein the fourth insulating layer has a light shielding property.

12. The display module of claim 1, further comprising:
a scan driver; and
a data driver,
wherein the plurality of first lines comprise at least a portion of a data line receiving a data signal from the data driver, at least a portion of a scan line receiving a scan signal from the scan driver, and at least a portion of an emission control line receiving an emission control signal from the scan driver.

13. The display module of claim 12, wherein the plurality of second lines comprise at least a portion of a first power line, which provides a first electric potential to one of a plurality of transistors in the first portion, and at least a portion of a second power line, which provides the first electric potential to at least one capacitor in the first portion.

14. The display module of claim 13, further comprising:
a fourth insulating layer disposed on the plurality of third lines;
an anode electrode disposed on the fourth insulating layer;
an emission layer disposed on the anode electrode; and
a cathode electrode disposed on the emission layer,
wherein the plurality of third lines comprise at least a portion of a third power line, which provides a second electric potential different from the first electric potential to the cathode electrode, and at least a portion of an initializing power line, which provides an initialization potential to one of the plurality of transistors.

15. The display module of claim 13, wherein the plurality of second portions comprise a first connecting portion extending in a first direction, a second connecting portion extending in a second direction crossing the first direction, a third connecting portion extending in a third direction opposite to the first direction, and a fourth connecting portion extending in a fourth direction opposite to the second direction,
wherein the first power line is disposed on the first connecting portion or the third connecting portion, and
wherein the second power line is disposed on the second connecting portion or the fourth connecting portion.

16. A display module, comprising:
a base including a plurality of unit portions, each of the plurality of unit portions including a first portion and four second portions extending from the first portion;
a plurality of transistors disposed on the first portion;
a capacitor disposed on the first portion;
a plurality of first lines disposed on the four second portions;
a plurality of second lines each overlapped with a corresponding first line of the plurality of first lines; and
a plurality of third lines each overlapped with a corresponding first line of the plurality of first lines and a corresponding second line of the plurality of second lines.

17. The display module of claim 16, wherein each of the plurality of second lines is overlapped with at least two adjacent first lines of the plurality of first lines, and
wherein, when viewed in a plan view, a width of each of the plurality of second lines is larger than a width of each of the plurality of first lines and a width of each of the plurality of third lines.

18. The display module of claim 16, wherein each of the plurality of transistors comprises an input electrode, an output electrode, and a control electrode,
wherein the control electrode comprises a first metal material, and
wherein each of the output electrode, the input electrode, the plurality of first lines, the plurality of second lines, and the plurality of third lines comprises a second metal material different from the first metal material.

19. A display module, comprising:
a plurality of first portions spaced apart from each other;
a plurality of second portions, wherein each of the plurality of second portions extends from a first portion of the plurality of first portions to connect two adjacent first portions of the plurality of first portions to each other; and
a plurality of pixels disposed on the plurality of first portions,
wherein the each of the plurality of second portions comprises:
a first layer in which at least two lines of a plurality of data lines, a plurality of scan lines, and an emission control line are disposed;
a second layer in which a first power line providing a first electric potential to at least one of the plurality of pixels is disposed; and
a third layer in which at least one line of a second power line and an initializing power line is disposed, the second power line providing a second electric potential to at least one of the plurality of pixels and the initializing power line supplying a third electric potential to at least one of the plurality of pixels, and
wherein each of the plurality of first portions is connected to four second portions of the plurality of second portions.

* * * * *